US010381984B2

(12) United States Patent
Wu et al.

(10) Patent No.: US 10,381,984 B2
(45) Date of Patent: *Aug. 13, 2019

(54) AMPLIFIERS AND AMPLIFIER MODULES WITH SHUNT INDUCTANCE CIRCUITS THAT INCLUDE HIGH-Q CAPACITORS

(71) Applicant: NXP USA, Inc., Austin, TX (US)

(72) Inventors: Yu-Ting David Wu, Schaumburg, IL (US); Enver Krvavac, Kildeer, IL (US); Joseph Gerard Schultz, Wheaton, IL (US); Nick Yang, Wilmette, IL (US); Damon G. Holmes, Scottsdale, AZ (US); Shishir Ramasare Shukla, Chandler, AZ (US); Jeffrey Kevin Jones, Chandler, AZ (US); Elie A. Maalouf, Mesa, AZ (US); Mario Bokatius, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/846,162

(22) Filed: Dec. 18, 2017

(65) Prior Publication Data

US 2018/0175802 A1    Jun. 21, 2018

Related U.S. Application Data

(63) Continuation-in-part of application No. 15/379,789, filed on Dec. 15, 2016.

(51) Int. Cl.
*H03F 3/68* (2006.01)
*H03F 1/02* (2006.01)
(Continued)

(52) U.S. Cl.
CPC .......... *H03F 1/0288* (2013.01); *H01L 23/66* (2013.01); *H01L 27/0629* (2013.01); *H03F 1/56* (2013.01);
(Continued)

(58) Field of Classification Search
CPC .......... H03F 1/0288; H03F 3/213; H03F 1/56; H03F 3/195
(Continued)

(56) References Cited

U.S. PATENT DOCUMENTS 5,973,567 A   10/1999 Heal et al.
6,424,223 B1   7/2002 Wang et al.
(Continued)

FOREIGN PATENT DOCUMENTS

JP            6026062 B1    11/2016
WO        2006/016299 A1    2/2006

OTHER PUBLICATIONS

Qureshi, J. H. "A wide-band 20W LMOS Doherty power amplifier", IEEE MTT-S International Microwave Symposium Digest, pp. 1504-1507 (May 2010).
(Continued)

*Primary Examiner* — Khanh V Nguyen
*Assistant Examiner* — Khiem D Nguyen
(74) *Attorney, Agent, or Firm* — Sherry W. Schumm

(57) ABSTRACT

A Doherty amplifier module includes first and second amplifier die. The first amplifier die includes one or more first power transistors configured to amplify, along a first signal path, a first input RF signal to produce an amplified first RF signal. The second amplifier die includes one or more second power transistors configured to amplify, along a second signal path, a second input RF signal to produce an amplified second RF signal. A phase shift and impedance inversion element is coupled between the outputs of the first and second amplifier die. A shunt circuit is coupled to the output of either or both of the first and/or second amplifier die. The shunt circuit includes a series coupled inductance and high-Q capacitor (e.g., a metal-insulator-metal (MIM) capacitor), and the shunt circuit is configured to at least
(Continued)

partially resonate out the output capacitance of the amplifier die to which it is connected.

22 Claims, 6 Drawing Sheets

(51) Int. Cl.
| | |
|---|---|
| *H01L 27/06* | (2006.01) |
| *H01L 23/66* | (2006.01) |
| *H03F 3/195* | (2006.01) |
| *H03F 1/56* | (2006.01) |
| *H03F 3/213* | (2006.01) |
| *H01L 27/085* | (2006.01) |

(52) U.S. Cl.
CPC ............ *H03F 1/565* (2013.01); *H03F 3/195* (2013.01); *H03F 3/213* (2013.01); *H01L 27/085* (2013.01); *H01L 2223/6611* (2013.01); *H01L 2223/6616* (2013.01); *H01L 2223/6655* (2013.01); *H01L 2223/6677* (2013.01); *H03F 2200/318* (2013.01); *H03F 2200/387* (2013.01); *H03F 2200/411* (2013.01); *H03F 2200/451* (2013.01)

(58) Field of Classification Search
USPC ...................................... 330/295, 124 R, 307
See application file for complete search history.

(56) References Cited

U.S. PATENT DOCUMENTS

| | | |
|---|---|---|
| 6,833,761 B2 | 12/2004 | Staudinger et al. |
| 7,078,976 B2 | 7/2006 | Blednov |
| 7,255,573 B2 | 8/2007 | He et al. |
| 8,487,703 B2 | 7/2013 | Blednov |
| 8,653,889 B1 | 2/2014 | Acimovic et al. |
| 8,717,099 B2 | 5/2014 | Wilson et al. |
| 8,717,102 B2 | 5/2014 | Wilson et al. |
| 9,621,115 B1 | 4/2017 | Wu |
| 2011/0204980 A1 | 8/2011 | Bleonov |
| 2014/0145791 A1 | 5/2014 | Svechtarov |
| 2015/0119107 A1 | 4/2015 | Bouny |
| 2015/0372425 A1 | 12/2015 | Fazelpour et al. |
| 2016/0087586 A1 | 3/2016 | Szymanowski et al. |
| 2016/0087588 A1* | 3/2016 | Szymanowski ......... H01L 23/66 330/307 |
| 2016/0181992 A1 | 6/2016 | Holmes et al. |
| 2018/0159479 A1 | 6/2018 | Wu et al. |

OTHER PUBLICATIONS

Sutono, A. et a. "High-Q LTCC-based passive library for wireless system-on-package (SOP) module development", IEEE Transactions on Microwave Theory and Techniques, vol. 49, No. 10, pp. 1715-1724 (Oct. 2001).

Wood J. et al. "An Extrinsic Component Parameter Extraction Method for High Power RF LDMOS Transistors", IEEE MTT-S International Microwave Symposium Digest, pp. 607-610 (Jun. 2008).

Notice of Allowance; U.S. Appl. No. 15/379,789; 10 pages (dated Mar. 21, 2019).

Notice of Allowance; U.S. Appl. No. 15/366,550; 12 pages dated Mar. 7, 2019.

Non Final Office Action; U.S. Appl. No. 15/379,789; 9pages (dated Jan. 12, 2018).

Notice of Allowance; U.S. Appl. No. 15/379,789; 10 pages (dated Dec. 18, 2018).

Notice of Allowance dated Jun. 13, 2018 for U.S. Appl. No. 15/379,789 9 pgs.

Notice of Allowance dated Aug. 3, 2018 for U.S. Appl. No. 15/379,789 3 pgs.

Non-Final Office Action dated Aug. 30, 2018 for U.S. Appl. No. 15/366,550, 12 pgs.

Non-Final Office Action dated Jan. 18, 2018 for U.S. Appl. No. 15/366,550,7 pgs.

* cited by examiner

US 10,381,984 B2

AMPLIFIERS AND AMPLIFIER MODULES WITH SHUNT INDUCTANCE CIRCUITS THAT INCLUDE HIGH-Q CAPACITORS

CROSS-REFERENCE TO RELATED APPLICATION

This application is a continuation-in-part application of co-pending, U.S. patent application Ser. No. 15/379,789, filed on Dec. 15, 2016.

TECHNICAL FIELD

Embodiments of the subject matter described herein relate generally to radio frequency (RF) amplifiers, and more particularly to Doherty amplifiers and Doherty amplifier modules.

BACKGROUND

Wireless communication systems employ power amplifiers for increasing the power of radio frequency (RF) signals. In a wireless communication system, a power amplifier forms a portion of the last amplification stage in a transmission chain before provision of the amplified signal to an antenna for radiation over the air interface. High gain, high linearity, stability, and a high level of power-added efficiency are characteristics of a desirable amplifier in such a wireless communication system.

In general, a power amplifier operates at maximum power efficiency when the power amplifier transmits close to saturated power. However, power efficiency tends to worsen as output power decreases. Recently, the Doherty amplifier architecture has been the focus of attention not only for base stations but also for mobile terminals because of the architecture's high power-added efficiency over a wide power dynamic range.

The high efficiency of the Doherty architecture makes the architecture desirable for current and next-generation wireless systems. However, the architecture presents challenges in terms of semiconductor package design. Current Doherty amplifier semiconductor package designs call for the use of discrete devices, conductors, and integrated circuits to implement each amplification path. For example, the carrier and peaking amplification paths each may include a distinct power transistor IC die, along with distinct inductance and capacitance components. These distinct power transistor IC die and components are maintained a distance apart in a typical device package in order to limit potential performance degradation that may occur due to signal coupling between the carrier and peaking amplifiers. More specifically, undesirable signal coupling between the carrier and peaking amplifiers may involve the transfer of energy between components of the carrier and peaking amplifier paths through magnetic and/or electric fields associated with the signals carried on those amplifier paths. Unfortunately, the desire to maintain a significant spatial distance between amplifier paths in a device package in order to reduce coupling between the paths presents challenges in the design of small Doherty amplifier modules.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
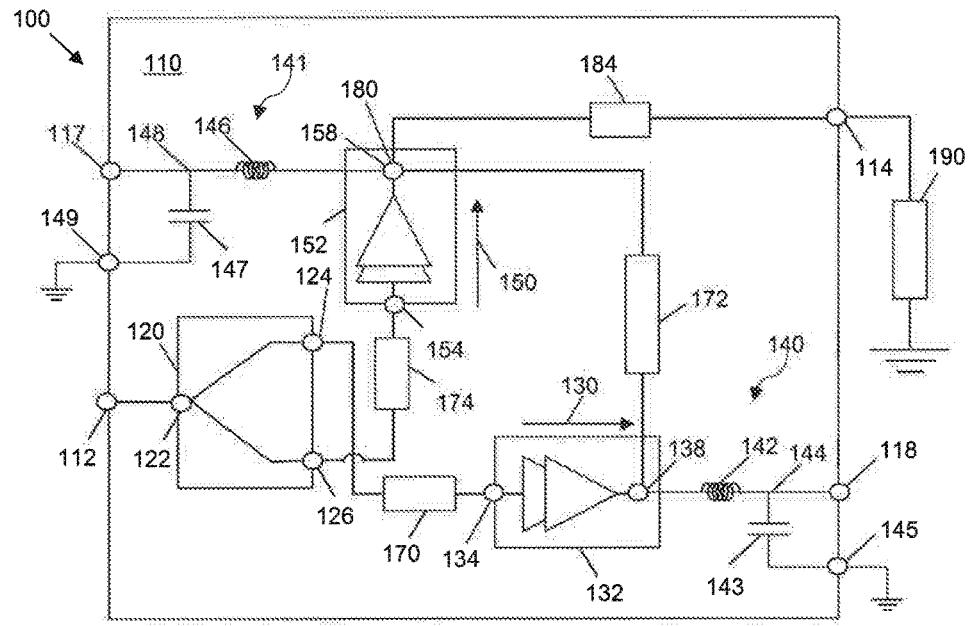
FIG. 1 is a schematic diagram of a Doherty amplifier, in accordance with an example embodiment.

A typical two-way Doherty amplifier implementation includes a radio frequency (RF) signal splitter configured to divide an input RF signal into two signals (referred to as a carrier signal and a peaking signal herein). The amplifier also includes parallel carrier and peaking amplifier paths configured to amplify the carrier and peaking signals, respectively, and a signal combiner configured to combine the amplified carrier and peaking signals. In addition, various phase shift and impedance inversion elements are disposed along the carrier and peaking amplifier paths. For example, in a typical non-inverted Doherty amplifier architecture, a 90 degree phase shift is applied to the peaking signal prior to amplification along the peaking amplifier path, and a corresponding 90 degree phase shift and impedance inversion is applied to the carrier signal after amplification along the carrier amplifier path, and before the amplified carrier and peaking signals are combined together in phase at a combining node.

The carrier amplifier and the peaking amplifier each may be implemented using a single-stage or multiple-stage power transistor. Using nomenclature typically applied to field effect transistors (FETs), the carrier amplifier transistor and the peaking amplifier transistor each may include a control terminal (e.g., a gate) configured to receive an input RF signal, and two current conducting terminals (e.g., a drain terminal and a source terminal). In some configurations, each source terminal is coupled to a ground reference node, and the amplified carrier and peaking signals are provided at the drain terminals of the carrier amplifier transistor and the peaking amplifier transistor, respectively. The drain terminal of the peaking amplifier may serve as the combining node for the amplified RF signals produced by the carrier and peaking amplifiers.

To provide a 90 degree phase shift and an impedance inversion between the drain of the carrier amplifier and the combining node (e.g., at the drain of the peaking amplifier transistor), the drain of the carrier amplifier may be electrically coupled (e.g., with first wirebonds) to the first end of a transmission line, and the second end of the transmission line may be electrically coupled (e.g., with second wirebonds) to the drain of the peaking amplifier (e.g., the combining node). Such a configuration may be referred to as a "90/0" Doherty amplifier, because about 90 degrees of phase shift is applied to the amplified carrier signal before it reaches the combining node, whereas no substantial phase shift is applied to the peaking signal before it reaches the combining node.

In a 90/0 Doherty amplifier, the electrical length of the transmission line between the drain terminals of the carrier and peaking amplifier transistors is determined by the drain capacitances of the transistors and the first and second wirebonds interconnecting the drain terminals to the transmission line. Although a 90 degree total phase shift should be applied between the intrinsic drains of the carrier and peaking amplifier transistors, the electrical length of the transmission line typically has a fixed value that is less than 90 degrees. More often, the electrical length has a value in the range of about 30 degrees to about 70 degrees. At higher frequencies, the fixed electrical length translates into a very short physical length, which may be difficult to realize when the amplifier transistor dies are arranged to reduce coupling between the carrier and peaking amplifier paths. This difficulty becomes even more acute when the dielectric constant of the substrate to which the transmission line is coupled is relatively high.

In a Doherty amplifier, coupling between signal paths can adversely affect amplifier performance. Coupling can be of two types, including electric coupling (commonly referred to as capacitive coupling) and magnetic coupling (commonly referred to as inductive coupling). Inductive and magnetic coupling occurs when a time-varying magnetic field exists between current conducting, parallel conductors that are in close proximity to one another. For example, one type of coupling in a Doherty amplifier may occur between arrays of signal wires (e.g., wirebond arrays), which are connected between the various electrical components making up each of the carrier and peaking amplifier paths. The performance of a Doherty amplifier can be adversely affected from coupling between adjacent wirebond arrays. Accordingly, minimum spacing requirements may be implemented between some of the wirebond arrays associated with the carrier and peaking amplifier paths, and particularly between the wirebond arrays coupled to the drain terminals of the carrier and peaking amplifier transistors.

In a conventional 90/0 Doherty amplifier, substantially all of the phase introduced by the transistor drain capacitances must be fully absorbed into the transmission line interconnecting the transistors' drain terminals. Accordingly, the electrical and physical lengths of the transmission line are dictated by the drain capacitances and the fundamental frequency of operation of the amplifier. As the fundamental operational frequency increases, the physical length of the transmission line must become shorter and shorter. Accordingly, the physical distance between the drain terminals also must become closer and closer in a conventionally-designed Doherty amplifier layout in order to be able to properly connect the drain terminals together with the transmission line. At some point, as the drain terminals in an amplifier design become closer and closer, undesirably strong coupling may begin to occur between the wirebond arrays coupled to the carrier and peaking drain terminals. It should be apparent from the above discussion that there is a real conflict in Doherty amplifier design between the desire, on the one hand, to continue to strive for more miniaturized Doherty amplifier circuits, and the desire, on the other hand, to design Doherty amplifier circuits that have excellent performance at higher and higher frequencies.

Embodiments of the inventive subject matter include Doherty amplifiers with a shunt inductance circuit coupled to the carrier amplifier transistor drain and/or to the peaking amplifier transistor drain. Essentially, the shunt inductance circuit embodiments are configured to allow for increases in the electrical length of the transmission line that interconnects the drain terminals, which in turn may enable the drain terminals to be placed farther apart to minimize coupling between the carrier and peaking paths. Incorporation of the inductance circuit(s) may enable the transmission line to be more physically realizable, even for Doherty amplifiers that are configured to operate at relatively high fundamental operating frequencies, and/or for Doherty amplifiers that are constrained to fit into relatively compact footprints. In addition, in certain embodiments, the inductance values implemented in the shunt inductance circuit(s) may be designed to be easily modifiable without re-design of the amplifier layout and/or transmission line configuration. For example, the modifications may be made by changing wirebond loop heights, changing chip inductor values, and so on. The ease of modification inherent in the various embodiments may enable the Doherty amplifiers to be easier to tune.

As mentioned above, a key feature of an embodiment of a Doherty amplifier is to include a shunt inductance circuit coupled to the carrier and/or peaking amplifier drain terminals. Essentially, the shunt inductance circuit(s) are configured to resonate out at least a portion of the transistors' parasitic drain-source capacitances. In various embodiments, each shunt inductance may be terminated with a shunt capacitance that produces an RF cold point node between the shunt inductance and the shunt capacitance at the fundamental operational frequency of the amplifier. Accordingly, video bandwidth circuits and/or DC bias circuits may be coupled to the transistor drains through the RF cold point node(s).

FIG. 1 is a schematic diagram of a Doherty amplifier 100, in accordance with an example embodiment. As indicated in FIG. 1 with box 110, some or all components of Doherty amplifier 100 may be implemented in a single device package or module. As will be explained in detail later, and in accordance with various embodiments, the configurations and orientations of the various amplifier components enable the size of the package or module to be significantly reduced, when compared with conventional packaging techniques using conventional components. These miniaturization benefits may be realized while still meeting gain, linearity, stability, and efficiency performance criteria. This is achieved, in part, by orienting the various amplifier components to establish an angular offset between portions of the carrier and peaking amplifier signal paths (e.g., paths 130, 150). The established angular offsets may have the beneficial effect of reducing coupling between signals carried along the carrier and peaking paths.

Doherty amplifier 100 includes an RF input node 112, an RF output node 114, a power splitter 120, a carrier amplifier path 130, a peaking amplifier path 150, a phase delay and impedance inversion element 172, and a combining node 180, in an embodiment. In addition, as will be discussed in more detail below, embodiments of first and second shunt inductance circuits 140, 141 (e.g., each including a shunt inductance 142, 146 and a shunt capacitance 143, 147) are coupled to the carrier and peaking amplifier paths 130, 150 to enable design flexibility in the physical and electrical length of the phase delay and impedance inversion element 172.

When incorporated into a larger RF system, the RF input node 112 is coupled to an RF signal source (not illustrated), and the RF output node 114 is coupled to a load 190 (e.g., an antenna or other load). The RF signal source provides an input RF signal, which is an analog signal that includes spectral energy that typically is centered around one or more carrier frequencies. Fundamentally, the Doherty amplifier 100 is configured to amplify the input RF signal, and to produce an amplified RF signal at the RF output node 114.

The power splitter 120 has an input 122 and two outputs 124, 126, in an embodiment. The power splitter input 122 is coupled to the RF input node 112 to receive the input RF signal. The power splitter 120 is configured to divide the RF input signal received at input 122 into first and second RF signals (or carrier and peaking signals), which are provided to the carrier and peaking amplifier paths 130, 150 through outputs 124, 126. According to an embodiment, the power splitter 120 includes a first phase shift element, which is configured to impart a first phase shift (e.g., about a 90 degree phase shift) to the peaking signal before it is provided to output 126. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the input RF signal received at the input 122 into two signals that are very similar with, in some embodiments, equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power.

In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The outputs 124, 126 of the power splitter 120 are connected to the carrier and peaking amplifier paths 130, 150, respectively. As shown in FIG. 1, the connection between output 126 and the peaking amplifier path 150 crosses over the connection between output 124 and the carrier amplifier path 130. As will be conveyed later in conjunction with the discussion of FIG. 3, this cross-over configuration may enable further compaction and miniaturization of the amplifier 100 by enabling a compact arrangement of input circuits 170, 174. In an alternate embodiment, outputs 124 and 126 may be reversed, enabling the outputs 124 and 126 to be connected to the carrier and peaking paths 130, 150 without one connection crossing over the other connection.

The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive in phase with each other at the power combining node 180.

According to an embodiment, the carrier amplifier path 130 includes an input circuit 170 (e.g., including an impedance matching circuit), a carrier amplifier die 132, and a phase shift and impedance inversion element 172. In addition, and according to an embodiment, the carrier amplifier path 130 includes a first shunt inductance circuit 140 coupled between the output of the carrier amplifier die 132 (e.g., the drain terminal 338 of transistor 337, FIG. 3) and a terminal 145 configured for coupling with a ground reference voltage.

The carrier amplifier die 132 includes an RF input terminal 134, an RF output terminal 138, and one or more amplification stages coupled between the input and output terminals 134, 138, in various embodiments. The RF input terminal 134 is coupled through input circuit 170 to the first output 124 of the power splitter 120, and thus the RF input terminal 134 receives the carrier signal produced by the power splitter 120.

Each amplification stage of the carrier amplifier die 132 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to the RF input terminal 134, one of the current-carrying terminals (e.g., the drain terminal or the source terminal) is electrically connected to the RF output terminal 138, and the other current-carrying terminal (e.g., the source terminal or the drain terminal) is electrically connected to a ground reference (or another voltage reference). Conversely, a two-stage device would include two power transistors coupled in series, where a first transistor functions as a driver amplifier transistor that has a relatively low gain, and a second transistor functions as an output amplifier transistor that has a relatively high gain. In such an embodiment, the control terminal of the driver amplifier transistor is electrically connected to the RF input terminal 134, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 138, and the other current-carrying terminal of the output amplifier transistor (e.g., the source terminal or the drain terminal) is electrically connected to the ground reference (or another voltage reference).

In addition to the power transistor(s), portions of input and output impedance matching networks and bias circuitry (not illustrated in FIG. 1) also may be monolithically formed as portions of the carrier amplifier die 132 and/or electrically coupled to the carrier amplifier die 132. Further, in an embodiment in which the carrier amplifier die 132 is a two-stage device, an interstage matching network (not illustrated in FIG. 1) also may be monolithically formed as a portion of the carrier amplifier die 132.

The RF output terminal 138 of the carrier amplifier die 132 is coupled to the first shunt inductance circuit 140. The first shunt inductance circuit 140 includes a shunt inductance 142 coupled in series with a shunt capacitance 143 (e.g., a DC blocking capacitor). According to an embodiment, the first shunt inductance circuit 140 is configured so that an RF "cold point" is present at the node 144 between shunt inductor 142 and shunt capacitor 143. Accordingly, node 144 may be referred to herein as an "RF cold point node." More specifically, the capacitance of the shunt capacitor 143 is chosen to provide a virtual ground reference voltage for the RF electrical signals at node 144, such that inductive element 142 functions as a shunt inductance to the RF ground voltage. In addition, in an embodiment, the RF cold point node 144 is coupled to a drain bias voltage terminal 118, which may be coupled to a bias circuit for providing a DC drain bias voltage to the drain of the carrier amplifier die 132.

As will be described in more detail below, the series combination of inductive element 142 and capacitor 143 is configured to at least partially resonate out the effects of the parasitic drain-source capacitance, Cds, of the transistor of the carrier amplifier die 132. This enables the physical and electrical length of the phase shift and impedance inversion element 172 to be made longer than it would be if it was required to fully absorb all of the phase introduced by the transistor drain capacitance.

The amplitude of the circulating current in the shunt inductance circuit can be on the order of several Amperes in some systems. Accordingly, the output insertion loss may be dominated by the quality factor (Q) of inductive element 142 and capacitor 143. According to various embodiments, shunt capacitor 143 is selected to be a relatively high-Q surface mount capacitor, such as a metal-insulator-metal (MIM) capacitor (e.g., capacitor 343, FIG. 7), a capacitor integrated within an integrated passive device (IPD), a capacitor integrated within a low-temperature, co-fired ceramic (LTCC) device, or another type of surface mount capacitor with a relatively high Q. Due to the relatively large size of IPDs and the relatively-high cost of LTCC devices, shunt capacitor 143 is selected to be a MIM capacitor in some particular embodiments.

The RF output terminal 138 of the carrier amplifier die 132 also is coupled to the power combining node 180 through phase shift and impedance inversion element 172, in an embodiment. According to an embodiment, the impedance inversion element is a lambda/4 ($\lambda/4$) transmission line phase shift element (e.g., a microstrip line), which imparts about a 90 degree relative phase shift to the carrier signal after amplification by the carrier amplifier die 132. A first end of the impedance inversion element 172 is coupled to the RF output terminal 138 of the carrier amplifier die 132, and a second end of the phase shift element 172 is coupled to the power combining node 180.

As will be explained in more detail in conjunction with FIG. 3, an embodiment of the RF output terminal 138 of the carrier amplifier die 132 is configured to enable the connection between the carrier amplifier die 132 and the first end of the impedance inversion element 172 (e.g., implemented with a wirebond array) to extend in a direction that is angularly offset from (e.g., perpendicular to) the direction of the input signal to the carrier amplifier die 132 (e.g., as indicated with arrow 130). This may be accomplished, for example, by providing an elongated input terminal 134 (e.g., gate terminal) that is angularly offset from (e.g., perpendicular to) an elongated portion of the output terminal 138 (e.g., drain terminal) to which the impedance inversion element 172 is coupled.

Reference is now made to the peaking amplifier path 150, which includes a peaking amplifier die 152 and an input circuit 174 (e.g., including an impedance matching circuit), in an embodiment. In addition, and according to an embodiment, the peaking amplifier path 150 includes a second shunt inductance circuit 141 coupled between the output of the peaking amplifier die 152 (e.g., the drain terminal 358 of transistor 357, FIG. 3) and a terminal 149 configured for coupling with a ground reference voltage.

The peaking amplifier die 152 includes an RF input terminal 154, an RF output terminal 158, and one or more amplification stages coupled between the input and output terminals 154, 158, in various embodiments. The RF input terminal 154 is coupled to the second output 126 of the power splitter 120, and thus the RF input terminal 154 receives the peaking signal produced by the power splitter 120.

As with the carrier amplifier die 132, each amplification stage of the peaking amplifier die 152 includes a power transistor with a control terminal and first and second current-carrying terminals. The power transistor(s) of the peaking amplifier die 152 may be electrically coupled between the RF input and output terminals 154, 158 in a manner similar to that described above in conjunction with the description of the carrier amplifier die 132. Additional other details discussed with in conjunction with the description of the carrier amplifier die 132 also apply to the peaking amplifier die 152, and those additional details are not reiterated here for brevity.

The RF output terminal 158 of the peaking amplifier die 152 is coupled to the power combining node 180. According to an embodiment, the RF output terminal 158 of the peaking amplifier die 152 and the combining node 180 are implemented with a common element. More specifically, in an embodiment, the RF output terminal 158 of the peaking amplifier die 152 is configured to function both as the combining node 180 and as the output terminal 158 of the peaking amplifier die 152. In addition, the RF output terminal 158 is configured to enable a connection between the second end of the phase shift and impedance inversion element 172 and the peaking amplifier die 152 (e.g., implemented with a wirebond array) to extend in a direction that is angularly offset from (e.g., perpendicular to) the direction of the input signal to the peaking amplifier die 152 (e.g., as indicated with arrow 150). This may be accomplished, for example, by providing an elongated input terminal 154 (e.g., gate terminal) that is angularly offset from (e.g., perpendicular to) an elongated portion of the output terminal 158 (e.g., drain terminal) to which the phase shift element 172 is coupled.

The RF output terminal 158 of the peaking amplifier die 152 is coupled to the second shunt inductance circuit 141. Similar to the first shunt inductance circuit, the second shunt inductance circuit 141 also includes a shunt inductance 146 coupled in series with a shunt capacitance 147 (e.g., a DC blocking capacitor). According to an embodiment, the second shunt inductance circuit 141 also includes an RF cold point node 148 between shunt inductor 146 and shunt capacitor 147. Again, the capacitance of the shunt capacitor 147 is chosen to provide a virtual ground reference voltage for the RF electrical signals at node 148, such that inductive element 146 functions as a shunt inductance to the RF ground voltage. In addition, in an embodiment, the RF cold point node 144 is coupled to a drain bias voltage terminal 117, which may be coupled to a bias circuit for providing a DC bias voltage to the drain of the peaking amplifier die 152.

Once again, and as will be described in more detail below, the series combination of inductive element 146 and capacitor 147 is configured to at least partially resonate out the effects of the parasitic drain-source capacitance, Cds, of the transistor of the peaking amplifier die 152. As with the shunt inductance 142 coupled to the carrier amplifier path 130, the shunt inductance 146 coupled to the peaking amplifier path 150 also enables the physical and electrical length of the phase shift and impedance inversion element 172 to be made longer than it would be if it was required to fully absorb all of the phase introduced by the transistor drain capacitance. Again, and according to various embodiments, shunt capacitor 147 is selected to be a relatively high-Q surface mount capacitor, such as a MIM capacitor (e.g., capacitor 343, FIG. 7), a capacitor integrated within an IPD, a capacitor integrated within an LTCC device, or another type of surface mount capacitor with a relatively high Q.

Although both shunt inductance circuits 140, 141 may be included in the amplifier 100, in an embodiment, either of the shunt inductance circuits 140, 141 may be excluded from the amplifier 100, in other embodiments. In other words, one alternate embodiment of amplifier 100 may include shunt inductance circuit 140, and may exclude shunt inductance circuit 141, while another alternate embodiment of amplifier 100 may include shunt inductance circuit 141, and may exclude shunt inductance circuit 140.

The amplified carrier and peaking RF signals combine in phase at the combining node 180. The combining node 180 is electrically coupled to the RF output node 114 to provide the amplified and combined RF output signal to the RF output node 114. In an embodiment, an output impedance matching network 184 between the combining node 180 and the RF output node 114 functions to present proper load impedances to each of the carrier and peaking amplifier die 132, 152. The resulting amplified RF output signal is produced at RF output node 114, to which an output load 190 (e.g., an antenna) is connected.

Amplifier 100 is configured so that the carrier amplifier path 130 provides amplification for relatively low level input signals, and both amplification paths 130, 150 operate in combination to provide amplification for relatively high level input signals. This may be accomplished, for example, by biasing the carrier amplifier die 132 so that the carrier amplifier die 132 operates in a class AB mode, and biasing the peaking amplifier die 152 so that the peaking amplifier die 152 operates in a class C mode.

In the embodiment illustrated in FIG. 1 and described above, a first phase shift element in splitter 120 imparts about 90 degrees of phase shift to the peaking signal prior to amplification, and phase shift and impedance inversion element 172 similarly imparts about 90 degrees of phase shift to the amplified carrier signal so that the amplified carrier and peaking signals may combine in phase at the combining node 180. Such an architecture is referred to as a non-inverted Doherty amplifier architecture. In an alternate embodiment, a first phase shift element in splitter 120 may impart about 90 degrees of phase shift to the carrier signal prior to amplification, rather than to the peaking signal, and phase shift and impedance inversion element 172 may be included instead at the output of the peaking amplifier. Such an alternate architecture is referred to as an inverted Doherty amplifier architecture. In still other alternate embodiments, other combinations of phase shift elements may be implemented in the carrier and/or peaking paths 130, 150 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 180. For example, phase shifts greater than 90 degrees may be applied along the carrier and peaking paths 130, 150.

According to an embodiment, the physical components of the carrier and peaking paths 130, 150 are oriented, with respect to each other, so that corresponding portions of the carrier and peaking amplification paths 130, 150 extend in directions that are substantially different from each other. As used herein, the term "signal path" refers to the path followed by an RF signal through a circuit. For example, a portion of a first signal path through the carrier amplifier die 132 extends in a first direction (indicated by arrow 130) between the RF input and output terminals 134, 138. Similarly, a portion of a second signal path through the peaking amplifier die 152 extends in a second direction (indicated by arrow 150) between the RF input and output terminals 154, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. As used herein, the term "substantially different," when referring to the angular separation between directions of corresponding portions of the first and second signal paths, means that the angular separation between the path portions is at least +/−45 degrees.

According to an embodiment, the angular separation between directions of the portions of the first and second signal paths that traverse the carrier and peaking amplifier die 132, 152 is achieved by orienting the carrier and peaking amplifier die 132, 152 so that the signal paths between their respective RF input and output terminals 134, 138, 154, 158 are angularly separated. For example, the carrier and peaking amplifier die 132, 152 are oriented perpendicularly, in an embodiment, so that the directions of the portions of the signal paths through the carrier and peaking amplifier die 132, 152 also are perpendicular.

During operation, the angular separation of the signal paths through the carrier and peaking amplifier die 132, 152 may significantly reduce the amount of coupling between those portions of the signal paths, when compared with a system in which the carrier and peaking die and/or carrier and peaking signal paths run parallel with each other. Given this reduction in coupling between the signal paths, the carrier and peaking amplifier die 132, 152 may be positioned closer together than they could be with conventional parallel orientations, while still achieving acceptable performance. Accordingly, implementation of the various embodiments may enable high-performance Doherty amplifiers to be implemented in relatively small packages or modules, when compared with the sizes of packages or systems used to house conventionally-arranged Doherty amplifiers.

With the carrier and peaking amplifier die 132, 152 oriented as described above, the output terminals 138, 158 likely are significantly farther apart than they would be if the carrier and peaking amplifier die 132, 152 were oriented in parallel and placed side-by-side. Although the illustrated and described orientation may have significant benefits in terms of reducing coupling between the carrier and peaking signal paths, the relatively large distance (e.g., distance 362, FIG.

3) between the output terminals 138, 158 presents challenges to the design of the phase shift and impedance inversion element 172. More specifically, if the phase shift and impedance inversion element 172 must be relied upon to resonate out the entire effect of the drain-source capacitances, Cds, of the transistors of the carrier and peaking amplifier die 132, 152, the desired length of the phase shift and impedance inversion element 172 may be significantly shorter, at relatively high frequencies, than the distance between the output terminals 138, 158. This issue is overcome, according to various embodiments, by including one or both of the shunt inductance circuits 140, 141, as will now be explained in more detail in conjunction with FIG. 2.

Figure 2:
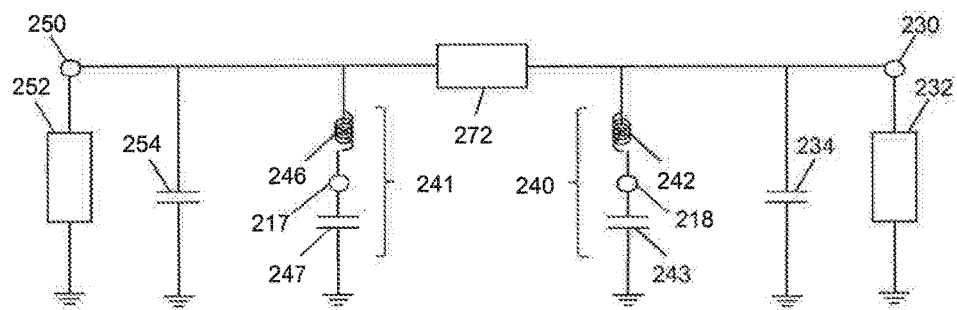
FIG. 2 is a schematic diagram representing the interconnection between the drains of a carrier device and a peaking device, with shunt inductance circuits configured to enable a longer transmission line between the drains, in accordance with an example embodiment.

More specifically, FIG. 2 is a schematic diagram representing the interconnection between the intrinsic drains 230, 250 of a carrier device 232 and a peaking device 252, with shunt inductance circuits 240, 241 configured to enable the inclusion of a longer transmission line 272 between the drains of the devices 232, 252, in accordance with an example embodiment. In FIG. 2, node 230 represents the intrinsic drain of a carrier device 232, and node 250 represents the intrinsic drain of a peaking device 252. Capacitor 234 represents the parasitic drain-source shunt capacitance of the carrier device 230, and capacitor 254 represents the parasitic drain-source shunt capacitance of the peaking device 250. Element 272 represents a phase shift and impedance inversion element (e.g., elements 172, 372, FIGS. 1, 3) interconnecting the drains of the carrier and peaking devices 232, 252, including wirebond arrays (e.g., arrays 361, 363, FIG. 3) connecting both ends of element 272 to the respective drain terminals. Finally, shunt inductance circuits 240, 241 represent embodiments of first and second shunt inductance circuits coupled to the drains of the carrier and peaking devices 232, 252, respectively, and configured to enable adjustments to the electrical length (and thus the physical length) of the phase shift and impedance inversion element 272.

Overall, to ensure that the amplified RF signal produced by the carrier amplifier 232 and the amplified RF signal produced by the peaking amplifier 252 combine in phase at the combining node (e.g., co-located with the intrinsic drain node 250 of the peaking device 252), the total electrical length between the intrinsic drain nodes 230, 250 should be ninety degrees. Thus, if the drain-source capacitances 234, 254 and the shunt inductance circuits 240, 241 were not present, the phase shift and impedance inversion element 272 would need to have a ninety degree electrical length, and a corresponding physical length. However, a more electrically accurate circuit models the drain-source capacitances 234, 254, and those capacitances 234, 254 warrant reductions in the electrical and physical length of the phase shift and impedance inversion element 272 that are proportional to the magnitude of the capacitances 234, 254. For example, in a symmetric Doherty amplifier in which the carrier and peaking amplifiers 232, 252 are the same size, the drain-source capacitances 234, 254 may have capacitance values in the range of a few picofarads (pF) (e.g., about 2.0 pF each, for example, under various conditions).

Assuming that the shunt inductance circuits 240, 241 are excluded from the circuit model, as is the case in a conventionally-designed Doherty amplifier, such drain-source capacitances may significantly reduce the permissible electrical and physical lengths of the phase shift and impedance inversion element 272. For example, the electrical length may be reduced to a value below 45 degrees, such as a value between 20 degrees and 40 degrees (e.g., an example value of 30 degrees). At relatively high frequencies, this translates to a very short physical length that may be too short to enable interconnection between the drains of the devices 232, 252.

Inclusion of one or both shunt inductance circuits 240, 241, according to various embodiments, enables the electrical length (and the physical length) of the phase shift and impedance inversion element 272 to be increased significantly, while still maintaining the 90 degree total phase shift between the intrinsic drain nodes 230, 250. More specifically, the first shunt inductance circuit 240, including shunt inductor 242 and shunt capacitor 243 connected at node 218, is configured to at least partially resonate out the drain-source capacitance 234, and the second shunt inductance circuit 241, including shunt inductor 246 and shunt capacitor 247 connected at node 217, is configured to at least partially resonate out the drain-source capacitance 254. This enables the electrical length (and thus the physical length) of the phase shift and impedance inversion element 272 to be increased.

For example, in an embodiment in which the drain-source capacitances 234, 254 have capacitance values of about 2.0 pF, and the shunt inductors 242, 246 have inductance values of about 1.7 nanohenries (nH), the electrical length of the phase shift and impedance inversion element 272 may be increased to a value above 45 degrees, such as a value between 60 degrees and 80 degrees (e.g., an example value of 70 degrees). In comparison to the conventional example explained above (i.e., an example in which shunt inductance circuits 240, 241 are excluded), this represents the ability to double the electrical and physical lengths of the phase shift and impedance inversion element 272. Particularly at higher frequencies, inclusion of the shunt inductance circuits 240, 241 may enable the intrinsic drain nodes 230, 250 to be placed a desired physical distance apart (e.g., distance 362, FIG. 3) that may avoid performance limiting coupling between the carrier and peaking amplifier paths.

Figure 3:
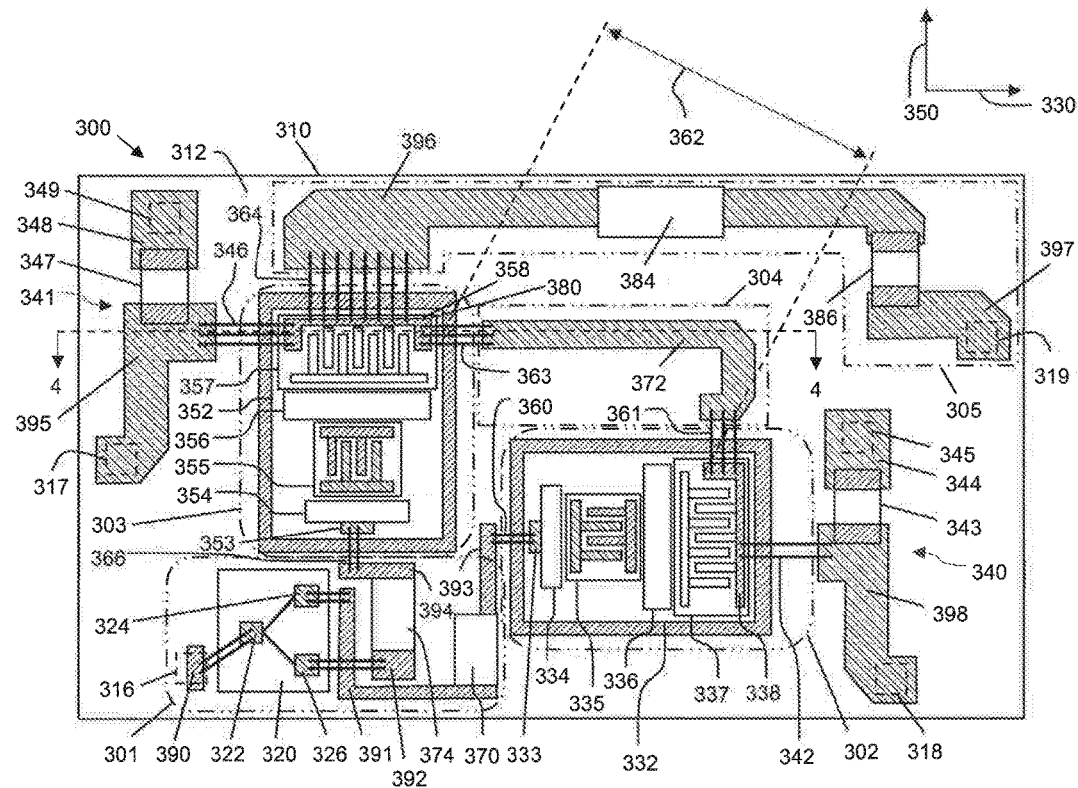
FIG. 3 is a top view of a Doherty amplifier module, in accordance with an example embodiment.

It should be noted that, in a practical circuit implementation, the electrical length of a phase shift and impedance inversion element (e.g., phase shift and impedance inversion elements 172, 272, 372, FIGS. 1-3) is a fixed value that may be desirably less than ninety degrees, such as a value in a range of about 30 degrees to about 70 degrees). At higher frequencies, this fixed electrical length may translate into a very short physical length that is difficult to realize with a phase shift and impedance inversion element that is implemented as a printed conductor on a substrate. This is particularly true when the dielectric constant of the substrate is high, which may be the case for a typical printed circuit board (PCB) type of substrate (e.g., substrate 310, FIG. 3).

Implementation of embodiments of shunt inductance circuits (e.g., circuits 140, 141, 240, 241, 340, 341, FIGS. 1-3) coupled to the carrier and/or peaking devices may overcome this issue by enabling an increase in the electrical and physical lengths of the phase shift and impedance inversion element that electrically connects the devices. This makes the practical circuit implementation more physically realizable and tunable, especially at relatively high frequencies. When the parasitic drain-source capacitances (e.g., capacitances 234, 254) are perfectly resonated out, the line length may be made to equal the theoretically desirable 90 degrees when the contribution from the wirebond arrays (e.g., wirebond arrays 361, 363, FIG. 3) are discarded. However, it may not be desirable to resonant out the parasitic drain-source capacitances completely, as that may introduce increased performance sensitivity to wirebond loop-height variations.

Figure 4:
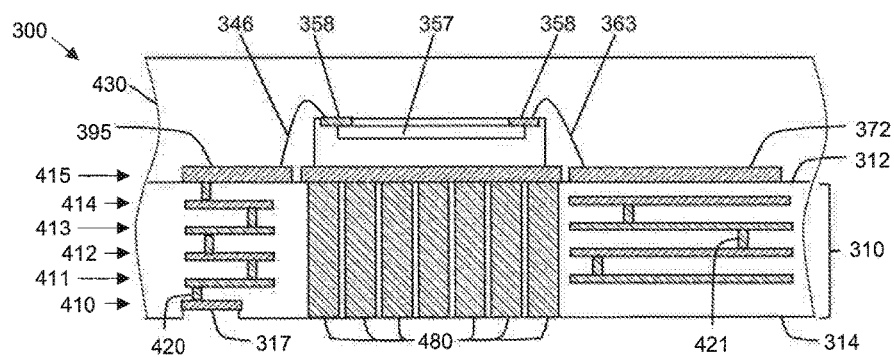
FIG. 4 is a cross-sectional, side view of the module of FIG. 3 along line 4-4.

An embodiment of a physical implementation of the Doherty amplifier circuit of FIG. 1 now will be described in detail in conjunction with FIGS. 3 and 4. More specifically, FIG. 3 is a top view of a Doherty amplifier module 300, in accordance with an example embodiment. FIG. 3 should be viewed simultaneously with FIG. 4, which is a cross-sectional, side view of a portion of the module 300 of FIG. 3 along line 4-4. Doherty amplifier module 300 includes a substrate 310, a power splitter 320 (e.g., power splitter 120, 200, FIGS. 1, 2), a carrier amplifier die 332 (e.g., carrier amplifier die 132, FIG. 1), a peaking amplifier die 352 (e.g., peaking amplifier die 152, FIG. 1), a phase shift and impedance inversion element 372 (e.g., phase shift and impedance inversion element 172, FIG. 1), a first shunt impedance circuit 340 (e.g., circuit 140, FIG. 1) coupled to the carrier amplifier die 332, a second shunt impedance circuit 341 (e.g., circuit 141, FIG. 1) coupled to the peaking amplifier die 352, and various other circuit elements, which will be discussed in more detail below.

The Doherty amplifier module 300 may be implemented as a land grid array (LGA) module, for example. Accordingly, the substrate 310 has a component mounting surface 312 and a land surface 314. The component mounting surface 312 and the components mounted to that surface 312 optionally may be covered with an encapsulant material 430 (e.g., a plastic encapsulant). In an alternate embodiment, the components could be contained within an air cavity, which is defined by various structures (not illustrated) overlying the mounting surface 312.

According to an embodiment, the substrate 310 is relatively small, which provides for a particularly compact Doherty amplifier. For example, the component mounting surface 312 may have a width (horizontal dimension in FIG. 3) and a length (vertical dimension in FIG. 3) in a range of about 5 millimeters (mm) to about 20 mm, although the width and/or length may be smaller or larger, as well. In a particular embodiment, for example, the component mounting surface may have a width of about 10 mm and a length of about 6 mm.

For example, the substrate 310 may be a multi-layer organic substrate (e.g., formed from PCB materials) with a plurality of metal layers 410, 411, 412, 413, 414, 415 which are separated by dielectric material. According to an embodiment, the bottom metal layer 410 is utilized to provide externally-accessible, conductive landing pads 316, 317, 318, 319, 345, 349 of the LGA, where the locations of some example landing pads 316-319, 345, 349 are indicated with dashed boxes in FIG. 3. These landing pads 316-319, 345, 349 (among others, not illustrated) enable surface mounting of the Doherty amplifier module 300 onto a separate substrate (not illustrated) that provides electrical connectivity to other portions of an RF system. Although module 300 is depicted as an LGA module, module 300 alternatively may be packaged as a pin grid array module, a quad flat no leads (QFN) module, or another type of package.

One or more other metal layers (e.g., layers 411, 412) of the substrate 310 may be used to convey DC voltages (e.g., DC bias voltages) and to provide a ground reference. Other layers (e.g., layers 413, 414) may be used to convey RF and other signals through the module 300. Additionally, a patterned metal layer 415 may be formed on the mounting surface 312 of the substrate 310. As will be discussed in more detail below, the patterned metal layer 415 may include a plurality of conductive contacts and traces 344, 348, 390-397 on the mounting surface 312, which facilitates electrical connection to die and other components that may be mounted to the mounting surface 312. In addition, a phase shift and impedance inversion element 372 may be formed from a portion of the patterned metal layer 415 (or from portions of one or more other conductive layers). Conductive vias (e.g., vias 420, 421) provide for electrical connectivity between the metal layers 410-415.

Each of the carrier and peaking amplifier die 332, 352 are monolithic power transistor integrated circuits (ICs) that may produce significant amounts of heat during operation. In addition, each of the carrier and peaking amplifier die 332, 352 also need access to a ground reference. Accordingly, in an embodiment, substrate 310 also includes a plurality of electrically and thermally conductive trenches 480 to which the carrier and peaking amplifier die 332, 352 are coupled (e.g., with solder, brazing material, silver sinter, or other die attach materials). The trenches 480 extend through the substrate thickness in first-die and second-die mounting zones 302, 303 to provide heat sinks and ground reference access to the carrier and peaking amplifier die 332, 352. For example, the conductive trenches 480 may be filled with copper or another thermally and electrically conductive material. In alternate embodiments, the trenches 480 may be replaced with conductive slugs (e.g., copper slugs) or with thermal vias.

Referring to the top view of module 300 in FIG. 3, a plurality of non-overlapping zones are defined at the mounting surface 312 of the substrate 310. More specifically, the non-overlapping zones include an input signal and splitter zone 301, a first-die mounting zone 302, a second-die mounting zone 303, an inter-amplifier impedance inverter zone 304, and an output match zone 305. Within the input signal and splitter zone 301, a conductive landing pad 316 exposed at the land surface 314 is electrically coupled through the substrate 310 to a conductive contact 390 at the mounting surface 312. The landing pad 316 and contact 390, along with the electrical connections between them, function as the RF input node (e.g., RF input node 112, FIG. 1) for the module 300.

The power splitter 320 is coupled to the mounting surface 312 in the input signal zone 301. According to an embodiment, the power splitter 320 may include one or more discrete die and/or components, although it is represented in FIG. 3 as a single element. The power splitter includes an input terminal 322 (e.g., input 122, FIG. 1) and two output terminals 324, 326 (e.g., outputs 124, 126, FIG. 1). The input terminal 322 is electrically coupled (e.g., through wirebonds, as shown) to conductive contact 390 to receive an input RF signal. In addition, the output terminals 324, 326 are electrically coupled (e.g., through additional wirebonds, as shown) to conductive contacts 391, 392 at the mounting surface 312. The power splitter 320 is configured to split the power of the input RF signal received through input terminal 322 into first and second RF signals (e.g., carrier and peaking signals), which are produced at the output terminals 324, 326. In addition, the power splitter 320 may include a first phase shift element configured to impart about a 90 degree phase shift to the RF signal provided at output terminal 326. As discussed previously, the power splitter 320 may consist of fixed-value, passive components, or the power splitter 320 may include variable phase shifters and/or attenuators (e.g., as with the power splitter 200, FIG. 2).

The first and second RF signals may have equal or unequal power, as discussed previously. The first RF signal produced at output terminal 324 and conveyed to conductive contact 391 is amplified through a carrier amplifier path. The carrier amplifier path includes an input circuit 370 (e.g., input circuit 170, FIG. 1) mounted within the input signal zone 301, a carrier amplifier die 332 (e.g., die 132, FIG. 1) mounted within the first-die mounting zone 302, a impedance inversion element 372 (e.g., impedance inversion element 172, FIG. 1) connected to the substrate 310 within the inter-amplifier impedance inverter zone 304, and a shunt inductance circuit 340 (e.g., shunt inductance circuit 140, FIG. 1) connected to the output terminal 338 of the carrier amplifier die 332.

The input circuit 370 is electrically connected between conductive contacts 391 and 393. Although the detail is not shown in FIG. 3, the input circuit 370 may include a plurality of discrete and/or integrated components (e.g., inductors and capacitors) configured to provide proper impedance matching between the first power splitter output 324 and the input to the carrier die 332.

Conductive contact 393 is electrically coupled (e.g., with wirebonds 360) to an RF input terminal 333 of the carrier amplifier die 332, in order to provide an RF carrier signal for amplification to the carrier amplifier die 332. The illustrated embodiment of carrier amplifier die 332 embodies a two-stage amplifier. More specifically, the electrical components of carrier amplifier die 332 include an RF input terminal 333, an input matching network 334, a driver transistor 335, an interstage matching network 336, an output transistor 337, and an RF output terminal 338. The driver and output transistors 335, 337 are coupled in series between the input and output terminals 333, 338. The driver transistor 335 is configured to apply a relatively low gain to the carrier signal, and the output transistor 337 is configured to apply a relatively high gain to the carrier signal after preliminary amplification by the driver transistor 335. In other embodiments, the carrier amplifier die 332 may embody a single stage amplifier, or may include more than two amplification stages.

Each of the transistors 335, 337 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 335, 337 may be a bipolar junction transistor (BJT). References herein to a "gate," "drain," and "source," which are commonly used to describe FETs, are not intended to be limiting, as each of these designations has analogous features for BJT implementations.

The input terminal 333 of die 332 is electrically coupled to the gate terminal of transistor 335 through input matching network 334, and the drain terminal of transistor 335 is electrically coupled to the gate terminal of transistor 337 through inter-stage matching network 336. According to an embodiment, the drain terminal of transistor 337 is electrically coupled to output terminal 338. Accordingly, the signal path through the carrier amplifier die 332 is in a direction extending from the RF input terminal 333 toward the RF output terminal 338, which direction is indicated by arrow 330.

An amplified RF carrier signal is produced by the carrier amplifier die 332 at the RF output terminal 338. In an embodiment, the RF output terminal 338 is electrically coupled to a first end of phase shift and impedance inversion element 372, which is at least partially exposed at the mounting surface 312, with a first wirebond array 361 (i.e., a plurality of parallel, closely spaced wirebonds).

In addition, according to an embodiment, the RF output terminal 338 is electrically coupled through a first shunt inductance circuit 340 to a landing pad 345. The first shunt inductance circuit 340 includes an inductive element (e.g., shunt inductive element 142, FIG. 1) in the form of a set of wirebonds 342, in series with a capacitor 343 (e.g., shunt capacitor 143, FIG. 1) in the form of a chip capacitor, a MIM capacitor (e.g., capacitor 343, FIG. 7), a capacitor integrated within an IPD, a capacitor integrated within an LTCC device, or another type of surface mount capacitor with a relatively high Q. The wirebonds 342 extend from the RF output terminal 338 to conductive trace 398. Capacitor 343 has a first terminal coupled to the conductive trace 398, and a second terminal coupled to conductive pad 344. The conductive pad 344 is electrically connected through the substrate 310 to landing pad 345. When integrated with a larger RF system, landing pad 345 may be connected to system ground.

According to an embodiment, the wirebonds 342 are configured to provide an inductance that is sufficient to resonate out at least some of the drain-source capacitance of transistor 337. As discussed in detail above, this enables the electrical and physical length of the phase shift and impedance inversion element 372 to be increased, in comparison with the electrical and physical length that may be used if the first shunt inductance circuit 340 were excluded from the module 300. For example, the wirebonds 342 may be configured to have an inductance value in a range of about 0.5 nanohenries (nH) to about 5.0 nH, although the wirebonds 342 may be configured to have a smaller or larger inductance value, as well. Although the illustrated embodiment shows the shunt inductive element as a set of two wirebonds 342, other embodiments may include more or fewer wirebonds to achieve a desired inductance value. Further, the inductance value may be controlled through variation of the loop heights of the wirebonds 342.

As discussed previously, the shunt capacitor 343 has a capacitance value that is chosen to provide a virtual ground reference voltage for the RF electrical signals at conductive trace 398, such that wirebonds 342 function as a shunt inductance to the RF ground voltage. Desirably, the shunt capacitor 343 is series resonant in band. For example, shunt capacitor 343 may have a capacitance value in a range of about 5.6 pF to about 33.0 pF, or more specifically in a range of about 8.0 pF to about 12.0 pF, although the capacitance value may be smaller or larger, as well.

Because trace 398 corresponds to an RF cold point node, in an embodiment, trace 398 may be used to provide a DC bias voltage to the output terminal 338 of transistor 337. Accordingly, in an embodiment, trace 398 also may be coupled through the substrate 310 to landing pad 318. Landing pad 318, in turn, may be coupled to a drain bias circuit in the RF system to which module 300 ultimately is connected.

According to an embodiment, the RF output terminal 338 of carrier amplifier die 332 includes an elongated first pad that is configured to enable wirebonds 361 to be connected to the first pad so that the wirebonds 361 extend in a direction that is angularly offset from (e.g., perpendicular to) the direction of the signal path through the carrier amplifier die 332 (e.g., wirebonds 361 may extend in the direction indicated by arrow 350). Further, the RF output terminal 338 may include an elongated second pad that is configured to enable the wirebonds 342 corresponding to the shunt inductive element of the shunt inductance circuit 340 to be connected to the second pad so that the wirebonds 342 extend in a direction that is substantially parallel to the direction of the signal path through the carrier amplifier die 332 (i.e., wirebonds 342 may extend in the direction indicated by arrow 330). As illustrated in FIG. 3, the wirebonds of the wirebond array 342 are aligned in the same direction as the RF signal path through the carrier amplifier die 332 (e.g., in the direction indicated by arrow 330). In an embodiment, wirebond arrays 342, 361 are perpendicularly arranged with respect to each other at adjacent sides of die 332.

As mentioned above, through the wirebond array 361, the RF output terminal 338 is electrically coupled to phase shift and impedance inversion element 372, which is located in the inter-amplifier impedance inverter zone 304. According to an embodiment, phase shift and impedance inversion element 372 is implemented with a transmission line (e.g., a microstrip line) having an electrical length of about lambda/4 ($\lambda$/4) or less. The transmission line has a first end that is proximate to the carrier amplifier die 332 (and more particularly within a wirebond length of the RF output terminal 338), and a second end that is proximate to the peaking amplifier die 352 (and more particularly within a wirebond length of the RF output terminal 358 of the peaking amplifier die 352). As used herein, "within a wirebond length" means within a distance between about 125 microns and about 200 microns, although the term may mean a smaller or larger distance, as well. According to an embodiment, the phase shift and impedance inversion element 372 may be formed from a portion of one or more of the metal layers of the module substrate 310 (e.g., one or both of layers 413 and/or 414, FIG. 4), and/or may be formed on a surface of the module substrate 310.

Moving back to the power splitter 320 in the input signal and splitter zone 301, the second RF signal (i.e., the peaking signal) produced at output terminal 326 of the power splitter 320 and conveyed to conductive contact 392 is amplified through a peaking amplifier path. The peaking amplifier path includes input circuit 374 within the input signal and splitter zone 301, a peaking amplifier die 352 (e.g., die 152, FIG. 1) mounted within the second-die mounting zone 303, and a shunt inductance circuit 341 (e.g., shunt inductance circuit 141, FIG. 1) connected to the output terminal 358 of the peaking amplifier die 352. As mentioned above, the power splitter 320 may impart about a 90 degree phase shift to the RF signal provided at output terminal 326. Accordingly, the phase of the peaking signal received at input terminal 353 of peaking die 352 is delayed by about 90 degrees with respect to the carrier signal received at input terminal 333 of carrier die 332.

The input circuit 374 is electrically connected between conductive contacts 392 and 394. Although the detail is not shown in FIG. 3, the input circuit 374 may include a plurality of discrete and/or integrated components (e.g., inductors and capacitors) configured to provide proper impedance matching between the second power splitter output 326 and the input to the peaking die 352. As shown in FIG. 3, the conductive contacts 391-394 and the input circuits 370, 374 are arranged so that the circuitry within the input signal and splitter zone 301 can be very compact. More specifically, the circuitry is arranged so that the output terminal 326 that produces the peaking signal is farther from the peaking amplifier die 352 than the output terminal 324 that produces the carrier signal. In addition, the conductive path between the output terminal 326 and the RF input terminal 353 of the peaking amplifier die 352 crosses over the conductive path between the output terminal 324 and the RF input terminal 333 of the carrier amplifier die 332 (although a cross-under also could be implemented). This cross-over is accomplished through the wirebonds (not numbered) that electrically couple power splitter output 326 to conductive contact 392. In other embodiments, relatively compact circuitry may be achieved without the cross-over/ cross-under configuration shown in FIG. 3. More specifically, the conductive path between the output terminal 326 and the RF input terminal 353 of the peaking amplifier die 352 may be configured so that it does not cross over (or under) the conductive path between the output terminal 324 and the RF input terminal 333 of the carrier amplifier die 332, in other embodiments.

Conductive contact 394 is electrically coupled (e.g., with wirebonds 366) to an RF input terminal 353 of the peaking amplifier die 352, in order to provide an RF carrier signal for amplification to the peaking amplifier die 352. The illustrated embodiment of peaking amplifier die 352 also embodies a two-stage amplifier. More specifically, the electrical components of peaking amplifier die 352 include an RF input terminal 353, an input matching network 354, a driver transistor 355, an interstage matching network 356, an output transistor 357, and an RF output terminal 358. The driver and output transistors 355, 357 are coupled in series between the input and output terminals 353, 358. The driver transistor 355 is configured to apply a relatively low gain to the peaking signal, and the output transistor 357 is configured to apply a relatively high gain to the peaking signal after preliminary amplification by the driver transistor 355. In other embodiments, the peaking amplifier die 352 may embody a single stage amplifier, or may include more than two amplification stages. Again, each of the transistors 355, 357 may be a FET or a BJT.

The input terminal 353 of die 352 is electrically coupled to the gate terminal of transistor 355 through input matching network 354, and the drain terminal of transistor 355 is electrically coupled to the gate terminal of transistor 357 through inter-stage matching network 356. According to an embodiment, the drain terminal of transistor 357 is electrically coupled to output terminal 358. Accordingly, the signal path through the carrier amplifier die 352 is in a direction extending from the first side 701 (FIG. 7) toward the second side 702, or from the RF input terminal 353 toward the RF output terminal 358, which direction is indicated by arrow 350.

An amplified RF peaking signal is produced by the peaking amplifier die 352 at the RF output terminal 358. In an embodiment, and as mentioned above, the RF output terminal 358 is electrically coupled to impedance inversion element 372 with wirebond array 363, and RF output terminal 358 functions as a combining node 380 (e.g., combining node 180, FIG. 1) at which the amplified and delayed carrier amplifier signal is combined, in phase, with an amplified peaking amplifier signal.

In addition, according to an embodiment, the RF output terminal 358 is electrically coupled through a second shunt inductance circuit 341 to a landing pad 349. The second shunt inductance circuit 341 includes an inductive element (e.g., shunt inductive element 146, FIG. 1) in the form of a set of wirebonds 346, in series with a capacitor 347 (e.g., shunt capacitor 147, FIG. 1) in the form of a chip capacitor, a MIM capacitor (e.g., capacitor 343, FIG. 7), a capacitor integrated within an IPD, a capacitor integrated within an LTCC device, or another type of surface mount capacitor with a relatively high Q. The wirebonds 346 extend from the RF output terminal 358 to conductive trace 395. Capacitor 347 has a first terminal coupled to the conductive trace 395, and a second terminal coupled to conductive pad 348. The conductive pad 348 is electrically connected through the substrate 310 to landing pad 349. When integrated with a larger RF system, landing pad 349 may be connected to system ground.

According to an embodiment, the wirebonds 346 are configured to provide an inductance that is sufficient to resonate out at least some of the drain-source capacitance of transistor 357. As discussed in detail above, this enables the electrical and physical length of the phase shift and impedance inversion element 372 to be increased, in comparison with the electrical and physical length that may be used if the first shunt inductance circuit 341 were excluded from the module 300. For example, the wirebonds 346 may be configured to have an inductance value in a range of about 0.5 nH to about 5.0 nH, although the wirebonds 346 may be configured to have a smaller or larger inductance value, as well. Although the illustrated embodiment shows the shunt inductive element as a set of two wirebonds 346, other embodiments may include more or fewer wirebonds to achieve a desired inductance value. Further, the inductance value may be controlled through variation of the loop heights of the wirebonds 346.

As discussed previously, the shunt capacitor 347 has a capacitance value that is chosen to provide a virtual ground reference voltage for the RF electrical signals at conductive trace 395, such that wirebonds 346 function as a shunt inductance to the RF ground voltage. Desirably, the shunt capacitor 347 is series resonant in band. For example, shunt capacitor 347 may have a capacitance value in a range of about 5.6 pF to about 33.0 pF, or more specifically in a range of about 8.0 pF to about 12.0 pF, although the capacitance value may be smaller or larger, as well.

Because trace 395 corresponds to an RF cold point node, in an embodiment, trace 395 may be used to provide a DC bias voltage to the output terminal 358 of transistor 357. Accordingly, in an embodiment, trace 395 also may be coupled through the substrate 310 to landing pad 317. Landing pad 317, in turn, may be coupled to a drain bias circuit in the RF system to which module 300 ultimately is connected.

The RF output terminal 358 of peaking amplifier die 352 includes an elongated first pad (e.g., pad 738, FIG. 7) that is configured to enable wirebonds of a first wirebond array 363 to be connected to the first pad so that the wirebonds extend in a direction that is angularly offset from (e.g., perpendicular to) the direction of the signal path through the peaking amplifier die 352 (e.g., wirebonds 363 may extend in the direction indicated by arrow 330). Further, the RF output terminal 358 may include an elongated second pad (e.g., pad 739, FIG. 5) that is configured to enable the wirebonds of the second wirebond array 364 to be connected to the second pad so that the wirebonds extend in a direction that is substantially parallel to the direction of the signal path through the carrier amplifier die 352 (i.e., wirebonds 364 may extend in the direction indicated by arrow 350). Further still, the RF output terminal 358 of peaking amplifier die 352 may include an elongated third pad (e.g., pad 740, FIG. 7) that is configured to enable wirebonds of a third wirebond array 346 to be connected to the third pad so that the wirebonds extend in a direction that is angularly offset from (e.g., perpendicular to) the direction of the signal path through the peaking amplifier die 352 (e.g., wirebonds 346 may extend in a direction that is 180 degrees offset from the direction indicated by arrow 330).

The signal path through the peaking amplifier die 352 is in a direction extending from the RF input terminal 353 to the RF output terminal 358, which direction is indicated by arrow 350. As can be seen in FIG. 3, the signal paths through the peaking and carrier amplifier die 352, 332 extend in significantly different directions, and more particularly the signal paths are perpendicular in the embodiment of FIG. 3.

According to an embodiment, except for the configurations of the RF output terminals 338, 358, the peaking amplifier die 352 may be structurally identical to the carrier amplifier die 332, meaning that the two dies 332, 352 include the same structural and electrical elements arranged and interconnected in the same manner. According to a further embodiment, the peaking amplifier die 352 and the carrier amplifier die 332 also are identical in size, rendering the Doherty amplifier module 300 a symmetric Doherty amplifier. In an alternate embodiment, the peaking amplifier die 352 and the carrier amplifier die 332 may have different sizes, rendering the Doherty amplifier module 300 an asymmetric Doherty amplifier. For example, the peaking amplifier die 352 may be larger than the carrier amplifier die 332 by a ratio (e.g., 1.6:1, 2:1, or some other ratio).

Either way, each die 332, 352 is rectangular in shape with parallel first and second sides, and parallel third and fourth sides extending between the first and second sides. In each die 332, 352, the RF input terminal 333, 353 is proximate to the first side of the die, and portions of the RF output terminal 338, 358 may be proximate to the second side of the die. The first sides of each die 332, 352 are oriented toward the input signal zone 301, and the first sides of the die 332, 352 are perpendicularly arranged, with respect to each other, in an embodiment. Said another way, the structurally identical carrier and peaking amplifier die 332, 352 are coupled to the mounting surface 312 of the substrate 310 so that the die 332, 352 are perpendicular to each other, rendering the RF signal paths through the die 332, 352 also perpendicular to each other. Even though the die 332, 352 may be positioned relatively close together, their perpendicular orientations may significantly reduce coupling between signals carried through and amplified by the die 332, 352.

As mentioned above, through the wirebond array 363, the RF output terminal 358 is electrically coupled to phase shift and impedance inversion element 372. Accordingly, the amplified carrier signal produced by the carrier amplifier die 332 is received at the RF output terminal 358 of the peaking amplifier die 352 through wirebond array 361, phase shift and impedance inversion element 372, and wirebond array 363. The amplified peaking signal produced by the peaking amplifier die 352 also is received at the RF output terminal 358, and the module 300 is configured so that the amplified carrier and peaking signals arrive and are combined at output terminal 358 (or combining node 380) in phase with each other.

Above some operational frequency threshold, as discussed in detail above, the linear distance 362 between the output terminals 338, 358 of the carrier and peaking die 332, 352 would be too long to accommodate a phase shift and impedance inversion element that is relied upon exclusively (i.e., without shunt inductance circuits 340, 341) to resonate out the source-drain capacitances of the transistors 337, 357. More specifically, if the phase shift and impedance inversion element 372 is relied upon to resonate out the entire effect of the drain-source capacitances of the transistors 337, 357, the desired physical length of the phase shift and impedance inversion element 372 may be significantly shorter, for operational frequencies above a high frequency threshold, than the linear distance 362 between the output terminals 338, 358. This issue is overcome, according to various embodiments, by including one or both of the shunt inductance circuits 340, 341, each of which at least partially resonates out the drain-source capacitances of the transistors 337, 357. In other words, whereas the phase shift and impedance inversion element 372 would have a first physical length (and thus a first electrical length) if both shunt inductance circuits 340, 341 were excluded from the module 300, the phase shift and impedance inversion element 372 may have a longer physical length (and thus a longer electrical length) when the shunt inductance circuits 340, 341 are included in the module 300. According to an embodiment, the inductance values of the shunt inductance circuits 340, 341 are selected to ensure that the phase shift and impedance inversion element 372 may be designed with a physical length that is at least as long as the distance 362 between the output terminals 338, 358.

According to an embodiment, the RF output terminal 358 (or combining node 380) is electrically coupled to conductive output trace 396 at the mounting surface 312 with wirebond array 364. As illustrated in FIG. 3, the wirebonds of the wirebond array 364 are aligned in the same direction as the RF signal path through the peaking amplifier die 352 (e.g., in the direction indicated by arrow 350). In an embodiment, wirebond arrays 363, 364 are perpendicularly arranged with respect to each other at adjacent sides of die 352, wirebond arrays 346, 364 also are perpendicularly arranged with respect to each other at adjacent sides of die 352, and wirebond arrays 363, 346 are arranged in parallel with each other at opposing sides of the peaking amplifier die 352. Accordingly, even though the wirebond arrays 363, 364 and wirebond arrays 346, 364 may be positioned relatively close together, their perpendicular orientations may significantly reduce coupling of RF signals carried through the wirebond arrays 346, 363, 364.

An output impedance matching network 384 and/or a decoupling capacitor 386 may be coupled along output trace 396, in an embodiment. The output impedance matching network 384 functions to present the proper load impedance to combining node 380. Although the detail is not shown in FIG. 3, the output impedance matching network 384 may include various discrete and/or integrated components (e.g., capacitors, inductors, and/or resistors) to provide the desired impedance matching. The output impedance matching network 384 is electrically coupled through the substrate 310 to conductive landing pad 319 exposed at the land surface 314. The landing pad 319 functions as the RF output node (e.g., RF output node 114, FIG. 1) for the module 300.

Besides the bias circuitry connections previously discussed (e.g., including elements 317, 318, 395, 398), module 300 also may include additional bias circuitry and/or bias circuitry connections configured to provide gate and drain bias voltages to some or all of the driver and output transistors 335, 355, 337, 357. For example, the bias circuitry may include, among other things, a plurality of landing pads (at the land surface 314 of the substrate 310), contacts (at the mounting surface 312 of the substrate 310), and other conductive structures and circuitry. Bias voltages provided to the gates and/or drains of the transistors 335, 355, 337, 357 facilitate Doherty operation of the module. For example, the transistors 335, 337 of the carrier amplifier die 332 may be biased to operate in class AB mode, and the transistors 355, 357 of the peaking amplifier die 352 may be biased to operate in class C mode. The above-described configuration corresponds to a non-inverted Doherty amplifier. In an alternate embodiment, modifications could be made to configure the module 300 to function as an inverted Doherty amplifier.

The above described embodiments include two-way Doherty power amplifier implementations, which include a carrier amplifier and one peaking amplifier. According to other embodiments, a Doherty power amplifier may include more than one peaking amplifier, or module 300 may be modified to implement types of amplifiers other than Doherty amplifiers. Said another way, modules configured to include shunt inductance circuits for at least partially resonating out output drain-source capacitances of the amplifiers' transistors thus may be utilized in amplifier configurations other than those illustrated and discussed herein.

Various modifications may be made to module 300 without departing from the scope of the inventive subject matter. For example, although substrate 310 is depicted, in FIG. 4, to include five metal layers 410-414, substrates that include more or fewer metal layers alternatively may be used. In addition, other types of substrates alternatively could be used, including ceramic substrates or other types of substrates. Further, alternate embodiments may include a power splitter and/or amplifier die that are configured as flip-chips. Further still, the carrier and peaking amplifier die 332, 352 and/or certain ones of the various sets of wirebond arrays 342, 346, 360, 361, 363, 364 may be arranged in non-perpendicular manners, so long as there is a significant angular separation (e.g., an angular separation of 45 degrees or more) between their respective orientations (e.g., between arrays 361 and 342, between arrays 363 and 364, and between arrays 364 and 346). In addition, each of the carrier and peaking amplifier die 332, 352 may include single stage amplifiers, or two distinct amplifier dies (one driver amplifier die and one output amplifier die) may be implemented along each path 330, 350.

In FIG. 3, particular example embodiments of shunt inductance circuits 340, 341 are illustrated, where each shunt inductance circuit 340, 341 includes a shunt inductance in the form of a set of wirebonds 342, 346. In alternate embodiments, a shunt inductance in a shunt inductance circuit may be configured in a different manner. In addition, although FIG. 3 illustrates an embodiment in which shunt inductance circuits 340, 341 are coupled to both the carrier amplifier die 332 and the peaking amplifier die 352, other embodiments may include a shunt inductance circuit coupled only to one of the carrier or peaking die.

Figure 5:
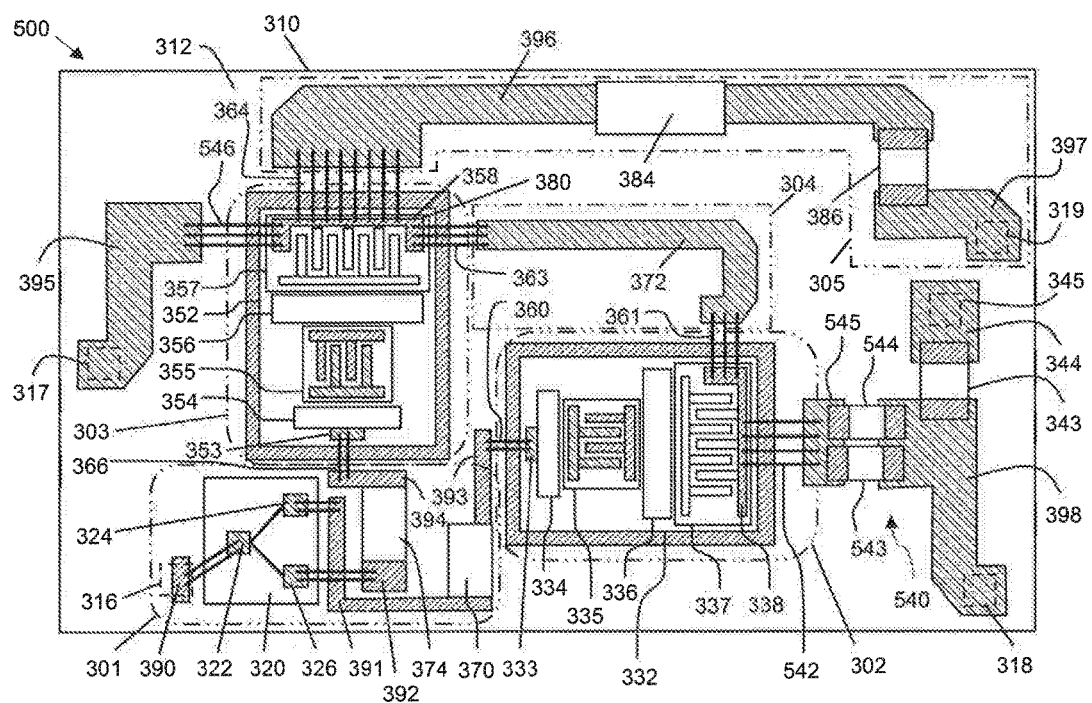
FIG. 5 is a top view of a Doherty amplifier module, in accordance with another example embodiment.

FIG. 5 is provided to illustrate both of the above mentioned alternate embodiments. More specifically, FIG. 5 is a top view of a Doherty amplifier module 500, in accordance with another example embodiment. The Doherty amplifier module 500 has many similarities to the Doherty amplifier module 300 of FIG. 3, and where features of module 500 are substantially similar or identical to analogous features of module 300, identical reference numbers are used. The various details and embodiments of the features of module 500 that are substantially similar or identical to analogous features of module 300 apply equally to the description of module 500. For brevity, those details and embodiments are not repeated here.

Module 500 differs from module 300 in at least two respects. First, whereas module 300 includes a shunt inductance circuit 340, 341 coupled to both the carrier amplifier die 332 and to the peaking amplifier die 352, module 500 includes a shunt inductance circuit 540 coupled only to the carrier amplifier die 332. On the peaking amplifier side, module 500 does include a wirebond array 546 coupled to conductive trace 395 (which in turn is coupled through the substrate 310 to landing pad 317), but the combination of components is intended to enable an AC bias to be provided to the output terminal 358 of the peaking amplifier die 352, rather than to provide a shunt inductance circuit for the purpose of resonating out some of the output drain-source capacitance of the peaking amplifier die 352. In still another embodiment, a shunt inductance circuit (for resonating out drain-source capacitance) may be coupled to the output terminal of the peaking amplifier die, whereas a shunt inductance circuit (for resonating out drain-source capacitance) may not be coupled to the output terminal of the carrier amplifier die.

Another significant difference between modules 300, 500 is in the configuration of the shunt inductance circuit 540 coupled to the output terminal 338 of the carrier amplifier die 332. More specifically, shunt inductance circuit 540 includes a first inductance in the form of wirebond array 542, and a second inductance in the form of parallel-coupled chip inductors 543, 544, where the first and second inductances are coupled in series. More specifically, the wirebond array 542 is coupled between the output terminal 338 of the carrier amplifier die 332 and a conductive pad 545 on the mounting surface 312, and the parallel-coupled chip inductors 543, 544 each have a first terminal coupled to conductive pad 545 and a second terminal coupled to conductive trace 398. The shunt inductance provided by the shunt inductance circuit 540 has an inductance value that is a combination of the inductance of the wirebond array 542 and the parallel-coupled chip inductors 543, 544. In other embodiments, other combinations of inductive components may be arranged to provide the shunt inductance of a shunt inductance circuit.

Figure 6:
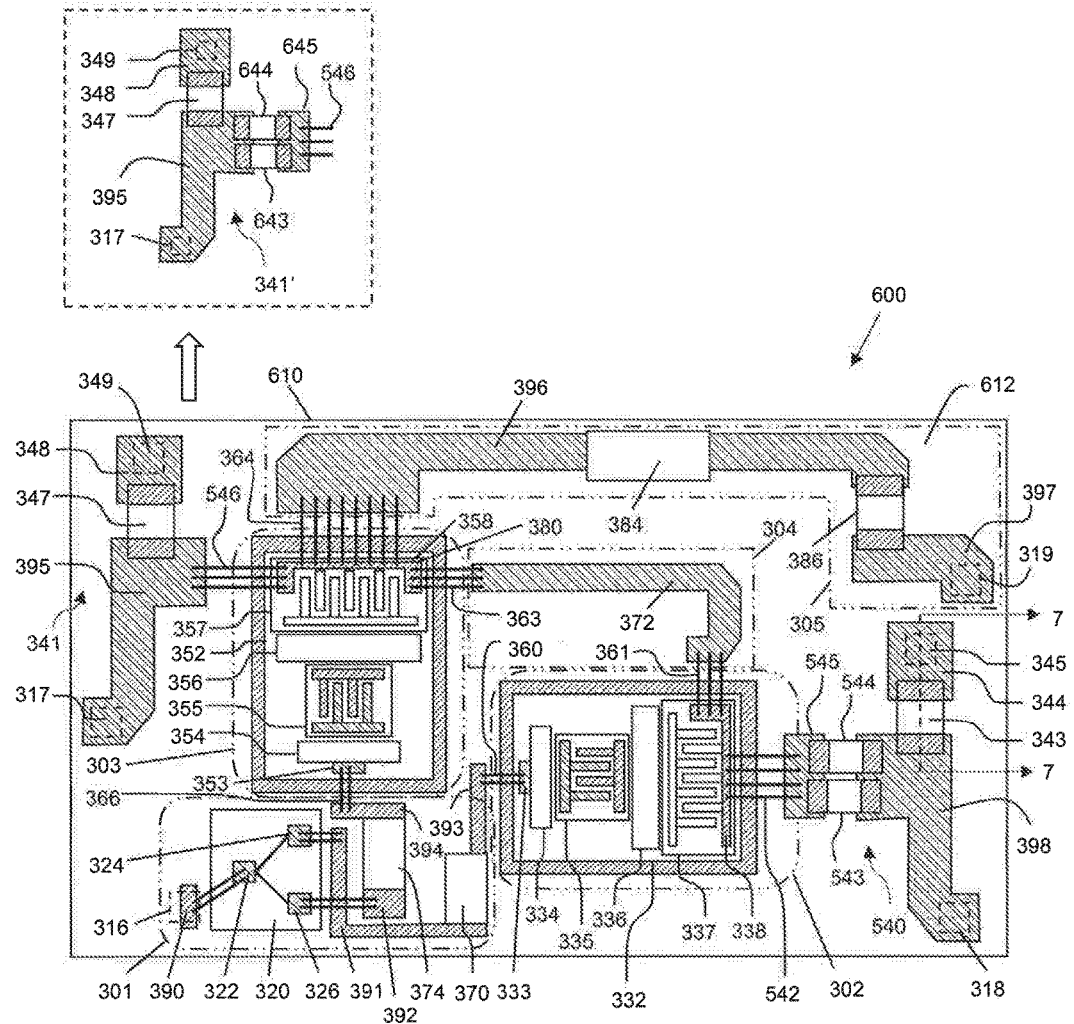
FIG. 6 is a top view of a Doherty amplifier module, in accordance with yet another example embodiment.

FIG. 6 is a top view of a Doherty amplifier module 600, in accordance with yet another example embodiment. The Doherty amplifier module 600 has many similarities to the Doherty amplifier modules 300 and 500 of FIGS. 3 and 5, and where features of module 600 are substantially similar or identical to analogous features of modules 300, 500, identical reference numbers are used. The various details and embodiments of the features of module 600 that are substantially similar or identical to analogous features of modules 300, 500 apply equally to the description of module 600. For brevity, some of those details and embodiments are not repeated here.

Module 600 includes shunt inductance circuits 540, 341 (or 341') coupled to both the carrier amplifier die 332 and the peaking amplifier die 352. Module 600 is similar to module 500 (FIG. 5) in that the configuration of the shunt inductance circuit 540 coupled to the output terminal 338 of the carrier amplifier die 332 includes a first inductance in the form of wirebond array 542, a second inductance in the form of parallel-coupled chip inductors 543, 544, and a capacitor 343, where the first and second inductances 542, 543, 544 and the capacitor 343 are coupled in series between the output terminal 338 of the carrier amplifier die 332 and landing pad 345. Again, the capacitor 343 may be implemented as a chip capacitor, a MIM capacitor, a capacitor integrated within an IPD, a capacitor integrated within an LTCC device, or another type of surface mount capacitor with a relatively high Q. Conductive trace 398 provides an RF cold point for the circuit, and a bias voltage may be applied to the RF cold point (and thus to the output terminal 338 of transistor 337) through landing pad 318.

Module 600 is similar to module 300 (FIG. 3) in that the shunt inductance circuit 341 coupled to the peaking amplifier die 352 includes an inductance in the form of wirebond array 546 and a capacitor 347 coupled in series with the wirebond array 546 between the output terminal 358 of transistor 357 and landing pad 349. Again, the capacitor 347 may be implemented as a chip capacitor, a MIM capacitor, a capacitor integrated within an IPD, a capacitor integrated within an LTCC device, or another type of surface mount capacitor with a relatively high Q. Conductive trace 395 provides an RF cold point for the circuit, and a bias voltage may be applied to the RF cold point (and thus to the output terminal 358 of transistor 357) through landing pad 317. In an alternative embodiment, as indicated with circuit 341' in the dashed box at the top of FIG. 6, an alternative shunt inductance circuit 341' coupled between the output terminal 358 of transistor 357 and landing pad 349 may include a series-coupled combination of wirebond array 546, chip inductor(s) 643, 644, and capacitor 347.

Figure 7:
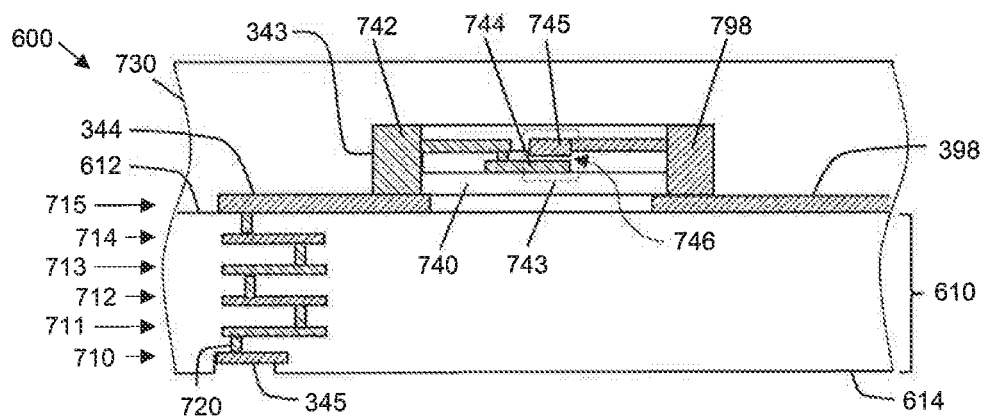
FIG. 7 is a cross-sectional, side view of the module of FIG. 6 along line 7-7, including a cross-sectional view of a metal-insulator-metal (MIM) capacitor coupled to a surface of the module.

As mentioned previously, the surface-mount capacitors in the output shunt inductance circuits (e.g., capacitors 143, 147, 243, 247, 343, 347) may be any of a variety of types of capacitors, and a high-Q MIM capacitor may have some advantages over other types of capacitors in terms of size and/or cost. FIG. 7 is a cross-sectional, side view of the module 600 of FIG. 6 along line 7-7, including a cross-sectional view of a MIM capacitor 343 coupled to a surface of the module 600.

Similar to Doherty amplifier module 300, module 600 may be implemented as an LGA module, for example, with a component mounting surface 612 and a land surface 614. The component mounting surface 612 and the components mounted to that surface 612 optionally may be covered with an encapsulant material 730 (e.g., a plastic encapsulant), or the components could be contained within an air cavity. For example, the substrate 610 may be a multi-layer organic substrate (e.g., formed from PCB materials) with a plurality of metal layers 710, 711, 712, 713, 714, 715 which are separated by dielectric material. According to an embodiment, the bottom metal layer 710 is utilized to provide externally-accessible, conductive landing pads (e.g., landing pad 345). A patterned metal layer 715 may be formed on the mounting surface 612 of the substrate 610, and the patterned metal layer 715 may include a plurality of conductive contacts and traces, such as traces 344, 398, on the mounting surface 612. Conductive vias (e.g., via 720) provide for electrical connectivity between the metal layers 710-715.

MIM capacitor 343 is a surface-mount device that is physically and electrically coupled to conductive traces 344, 398 (e.g., using solder, conductive adhesive, or other attachment means). According to an embodiment, MIM capacitor 343 includes a semiconductor substrate 740, a build-up structure coupled to the semiconductor substrate 740, and first and second conductive terminals 742, 798. In various embodiments, the semiconductor substrate 740 may comprise silicon, silicon-on-insulator (SOI), silicon-on-sapphire (SOS), gallium arsenide (GaAs), gallium nitride (GaN), GaN on silicon carbide, GaN on silicon, or other types of substrate materials. The build-up structure includes a plurality of conductive and dielectric layers formed over the semiconductor substrate 740.

A MIM capacitor structure 743 is formed from portions of the conductive and dielectric layers of the build-up structure. In conjunction with the description of the MIM capacitor structure 743, a conductive or dielectric "layer" may include a single material layer, or a composite structure formed from multiple material layers. More specifically, the MIM capacitor structure 743 includes a first electrode 744 formed from a portion of a first conductive layer (e.g., a layer of aluminum-copper-tungsten (AlCuW), aluminum copper (AlCu), and/or other suitable materials), a second electrode 745 formed from a portion of a second conductive layer (e.g., a layer of AlCuW, AlCu, and/or other suitable materials), and a portion of a dielectric layer 746 between the first and second electrodes 744, 745. In other words, in the MIM capacitor structure 743, the first and second electrodes 744, 745 are separated from each other across a portion of the dielectric layer 746. The first electrode 744 is electrically coupled to the first conductive terminal 742 through additional conductive vias and/or portions of one or more conductive layers. Similarly, the second electrode 745 is electrically coupled to the second conductive terminal 798 through additional conductive vias and/or portions of one or more conductive layers.

Figure 8:
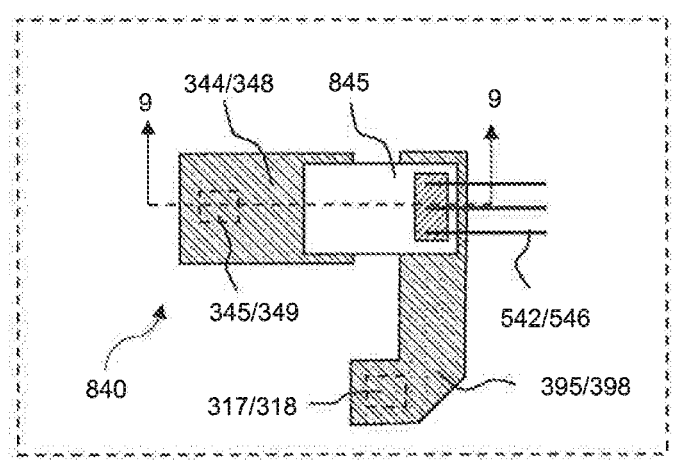
FIG. 8 is a top view of a portion of a Doherty amplifier module that includes an alternate embodiment of a shunt circuit.

FIG. 8 is a top view of a portion of a Doherty amplifier module that includes an alternate embodiment of a shunt circuit 840. The shunt circuit 840 could replace any or all of shunt circuits 340, 540, and/or circuits 341, 341', in various embodiments. Shunt circuit 840 includes a MIM capacitor 845 electrically coupled through wirebonds 542 or 546 (e.g., wirebonds 342, 542 or 346, 546, FIGS. 3, 5) to the output of the carrier amplifier die 332 or the peaking amplifier die 352, where the wirebonds 542 or 546 correspond to a shunt inductance (e.g., inductance 142 or 146, FIG. 1) between the output of die 332 or 352 and a ground reference.

Figure 9:
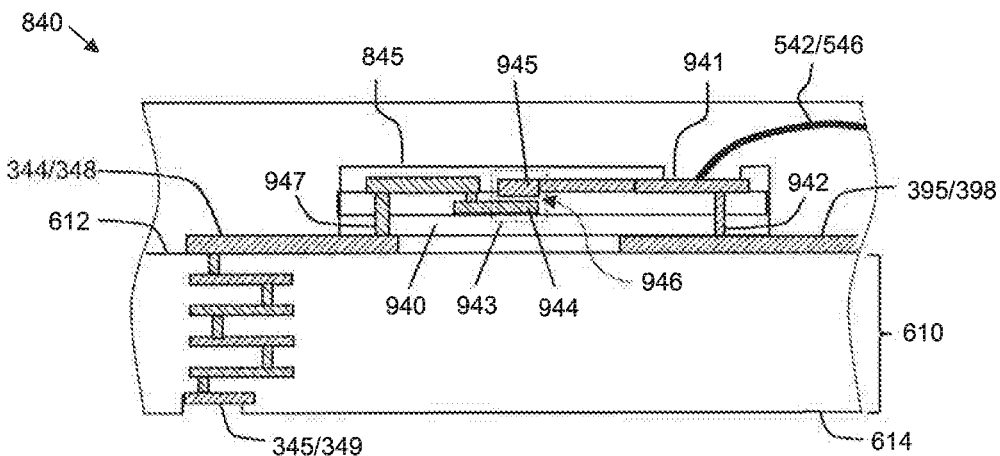
FIG. 9 is a cross-sectional, side view of the portion of the module of FIG. 8 along line 9-9, including a cross-sectional view of a MIM capacitor coupled to a surface of the module.

FIG. 9, which is a cross-sectional, side view of the portion of the module of FIG. 8 along line 9-9, shows that the MIM capacitor 845 is a surface-mount device that is physically coupled to a surface of the module. More specifically, the MIM capacitor 845 has a first terminal 942 physically and electrically coupled to conductive trace 395/398 (e.g., corresponding to node 144 or 148, FIG. 1, or trace 395 or 398, FIGS. 3, 5, 6), and a second terminal 947 physically and electrically coupled to conductive trace 344/348. As shown in FIG. 9, conductive trace 344/348 is electrically coupled to landing pad 345/349 (e.g., landing pad 345 or 349, FIGS. 3, 6) through various conductive features of substrate 610. Similarly, conductive trace 395/398 is electrically coupled to landing pad 317/318 (e.g., landing pad 317 or 318, FIGS. 3, 6) through various conductive features of substrate 610.

According to an embodiment, MIM capacitor 845 includes a semiconductor substrate 940, a build-up structure coupled to the semiconductor substrate 940, a bonding pad 941 to which wirebonds 542 or 546 are connected, and the first and second conductive terminals 942, 947 exposed at the bottom surface of the MIM capacitor 845. In various embodiments, the semiconductor substrate 940 may comprise silicon, SOI, SOS, GaAs, GaN, GaN on silicon carbide, GaN on silicon, or other types of substrate materials. The build-up structure includes a plurality of conductive and dielectric layers formed over the semiconductor substrate 940.

A MIM capacitor structure 943 within the MIM capacitor 845 includes a first electrode 944 formed from a portion of a first conductive layer (e.g., a layer of AlCuW, AlCu, and/or other suitable materials), a second electrode 945 formed from a portion of a second conductive layer (e.g., a layer of AlCuW, AlCu, and/or other suitable materials), and a portion of a dielectric layer 946 between the first and second electrodes 944, 945. The first electrode 944 is electrically coupled to the second conductive terminal 947 through additional conductive vias and/or portions of one or more conductive layers. Similarly, the second electrode 945 is electrically coupled to the bonding pad 941 and to the first conductive terminal 942 through additional conductive vias and/or portions of one or more conductive layers. As indicated in FIG. 9, the bonding pad 941 also is electrically coupled to the first conductive terminal 942 through conductive features (e.g., vias) of the MIM capacitor 845. Accordingly, the MIM capacitor 845 provides a conductive connection between wirebonds 542 or 546 (or between inductances 142 or 146) and conductive trace 395 or 398. The bonding pad 941, the terminal 942, the conductive structures interconnecting them, and conductive trace 395 or 398 provide an RF cold point for the circuit, in an embodiment, and a bias voltage may be applied to the RF cold point (and thus to the output of carrier amplifier die 332 or the peaking amplifier die 352) through conductive trace 395 or 398. The configuration of FIGS. 8 and 9 may enable the inductance of the shunt circuit (e.g., inductance 142 or 146, FIG. 1) to be established as a relatively small value, which is provided primarily through the inductance of the wirebonds 542 or 546.

Figure 10:
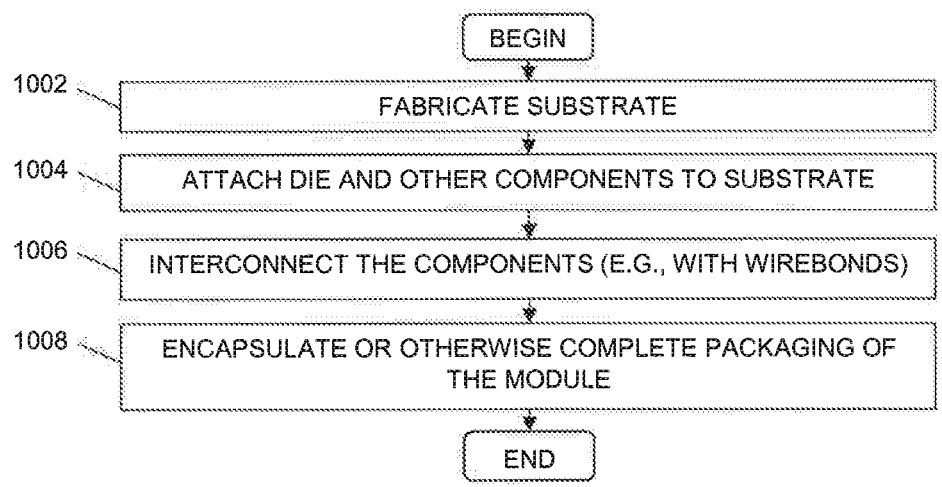
FIG. 10 is a flowchart of a method for fabricating a Doherty amplifier module, in accordance with an example embodiment.

FIG. 10 is a flowchart of a method for fabricating a Doherty amplifier module (e.g., Doherty amplifier module 300, FIG. 3), in accordance with an example embodiment. The method begins, in block 1002, by fabricating a substrate (e.g., substrate 310, FIG. 3), which includes a plurality of conductive features (e.g., landing pads, contacts, conductive traces, and conductive vias) arranged to provide desired electrical connectivity to subsequently attached discrete die and components. As discussed previously, a plurality of non-overlapping zones (e.g., zones 301-305, FIG. 3) may be defined at the mounting surface (e.g., surface 312, FIG. 3) of the substrate. Within die mounting zones (e.g., zones 302, 303, FIG. 3), the substrate may include conductive heat-sink features (e.g., conductive trenches 480, FIG. 4). In addition, in an embodiment, the substrate may include one or more transmission line elements (e.g., phase shift and impedance inversion element 372, FIG. 3), with physical and electrical lengths configured as described in detail above.

In block 1004, first and second amplifier die (e.g., carrier and peaking amplifier die 332, 352, FIG. 3) are attached to the mounting surface of the substrate in the die mounting zones. As discussed previously, the first and second amplifier die are attached so that RF signal paths through the die are oriented in substantially different directions (or angularly separated). For example, the first and second amplifier die may be attached to the substrate so that the die, and the RF signal paths through the die, are substantially perpendicular to each other. As described in detail above, the amplifier die may include output terminals (e.g., terminals 338, 358, FIG. 3) that are configured to enable wirebond arrays (e.g., wirebond arrays 342, 346, 361, 363, 364, 542, 546, FIGS. 3, 5) to be coupled to the die so that the wirebond arrays extend perpendicular to the signal directions (e.g., directions 330, 350) through the dies, in various embodiments.

In block 1006, additional discrete components are attached to the mounting surface of the substrate, and the various components are electrically connected together with additional wirebonds (e.g., including wirebonds 342, 346, 360, 361, 363, 364, 366, 542, 546, FIG. 3) and/or other conductive coupling means. For example, the additional discrete components may include surface mount inductors (e.g., inductors 543, 544, 643, 644, FIGS. 5, 6), surface mount capacitors (e.g., capacitors 343, 347, 386, FIGS. 3, 5-7), and other components. Finally, in block 1008, the various die and components overlying the mounting surface of the substrate are encapsulated (e.g., with encapsulant material 430, FIG. 4), or otherwise contained (e.g., in an air cavity package configuration) to complete the module.

Embodiments of amplifier modules and Doherty amplifiers include first and second power transistor die and a phase shift and impedance inversion element coupled to a substrate. The first power transistor die includes a first transistor integrated within the first power transistor die, and the first transistor includes a first drain terminal and a first intrinsic drain node corresponding to the first drain terminal. The second power transistor die includes a second transistor integrated within the second power transistor die, and the second transistor includes a second drain terminal and a second intrinsic drain node corresponding to the second drain terminal. The phase shift and impedance inversion element is connected between the first drain terminal and the second drain terminal, a total electrical length between the first and second intrinsic drain nodes is ninety degrees, and the phase shift and impedance inversion element has a first electrical length that is less than ninety degrees. The module or Doherty amplifier also includes a first shunt inductance circuit coupled to the first current conducting terminal. The first shunt inductance circuit includes a first shunt inductance that has a first inductance value that at least partially resonates out a drain-source capacitance of the first transistor to affect the first electrical length of the phase shift and impedance inversion element.

Other embodiments of amplifier modules and Doherty amplifiers include first and second power transistor dies coupled to a mounting surface of a substrate. The first power transistor die includes a first transistor integrated within the first power transistor die, and the first transistor includes a first drain terminal and a first intrinsic drain node corresponding to the first drain terminal. The second power transistor die includes a second transistor integrated within the second power transistor die, and the second transistor includes a second drain terminal and a second intrinsic drain node corresponding to the second drain terminal. The amplifier modules and Doherty amplifiers also include a phase shift and impedance inversion element connected between the first drain terminal and the second drain terminal, where a total electrical length between the first and second intrinsic drain nodes is ninety degrees, and the phase shift and impedance inversion element has a first electrical length that is less than ninety degrees. The amplifier modules and Doherty amplifiers also include a shunt circuit coupled to the first drain terminal, where the shunt circuit includes a shunt inductance coupled in series with a shunt capacitance, and the shunt circuit is configured to at least partially resonate out a drain-source capacitance of the first transistor. According to a further embodiment, the shunt capacitance includes a high-Q surface mount capacitor selected from a metal-insulator-metal (MIM) capacitor, a capacitor integrated within an integrated passive device (IPD), and a capacitor integrated within a low-temperature, co-fired ceramic (LTCC) device.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier module comprising:
   a substrate with a mounting surface;
   a first power transistor die coupled to the mounting surface, wherein the first power transistor die includes a first transistor integrated within the first power transistor die, and wherein the first transistor includes a first drain terminal and a first intrinsic drain node coupled to the first drain terminal;
   a second power transistor die coupled to the mounting surface, wherein the second power transistor die includes a second transistor integrated within the second power transistor die, and wherein the second transistor includes a second drain terminal and a second intrinsic drain node coupled to the second drain terminal;
   a phase shift and impedance inversion element connected between the first drain terminal and the second drain terminal, wherein a total electrical length between the first and second intrinsic drain nodes is ninety degrees, and the phase shift and impedance inversion element has a first electrical length that is less than ninety degrees; and
   a first shunt circuit coupled to the first drain terminal, wherein the first shunt circuit includes a first shunt inductance coupled in series with a first shunt capacitance, wherein the first shunt circuit is configured to at least partially resonate out a drain-source capacitance of the first transistor.

2. The amplifier module of claim 1, wherein the first shunt capacitance comprises:
   a high-Q surface mount capacitor selected from a metal-insulator-metal (MIM) capacitor, a capacitor integrated within an integrated passive device (IPD), and a capacitor integrated within a low-temperature, co-fired ceramic (LTCC) device.

3. The amplifier module of claim 1, wherein the first shunt capacitance comprises:
a metal-insulator-metal (MIM) capacitor that includes a semiconductor substrate and a build-up structure coupled to the semiconductor substrate, wherein the build-up structure includes a first conductive layer, a second conductive layer, and a dielectric layer, and wherein a first electrode of the MIM capacitor is formed from a portion of the first conductive layer, a second electrode of the MIM capacitor is formed from a portion of the second conductive layer, and the first and second electrodes are separated from each other across a portion of the dielectric layer.

4. The amplifier module of claim 1, wherein the first shunt circuit comprises:
the first shunt inductance in the form of a first wirebond array between the first drain terminal and a conductive contact; and
the first shunt capacitance having a first terminal coupled to the conductive contact, and a second terminal configured to be coupled to a ground reference.

5. The amplifier module of claim 4, wherein the first shunt capacitance has a capacitance value that results in a radio frequency (RF) cold point at the conductive contact, and wherein the amplifier module further comprises:
a conductive path configured to receive a bias voltage at the RF cold point.

6. The amplifier module of claim 1, wherein the first shunt circuit comprises:
the first shunt capacitance in the form of a metal-insulator-metal (MIM) capacitor with a bond pad, a first capacitor electrode coupled to the bond pad, and a second terminal coupled to a ground reference; and
the first shunt inductance in the form of a first wirebond array between the first drain terminal and the bond pad.

7. The amplifier module of claim 6, wherein the first shunt capacitance has a capacitance value that results in a radio frequency (RF) cold point at the bond pad, and wherein the amplifier module further comprises:
a conductive path configured to receive a bias voltage at the RF cold point, wherein the bond pad is electrically coupled to the conductive path.

8. The amplifier module of claim 1, wherein the first shunt circuit comprises:
the first shunt inductance in the form of a first wirebond array between the first drain terminal and a first conductive contact;
a second shunt inductance in the form of a chip inductor with a first terminal coupled to the first conductive contact, and a second terminal coupled to a second conductive contact; and
the first shunt capacitance having a first terminal coupled to the second conductive contact, and a second terminal configured to be coupled to a ground reference.

9. The amplifier module of claim 8, wherein the first shunt capacitance has a capacitance value that results in a radio frequency (RF) cold point at the second conductive contact, and wherein the amplifier module further comprises:
a conductive path configured to receive a bias voltage at the RF cold point.

10. The amplifier module of claim 1, further comprising:
a second shunt circuit coupled to the second drain terminal, wherein the second shunt circuit includes a second shunt inductance coupled in series with a second shunt capacitance, wherein the second shunt circuit is configured to at least partially resonate out a drain-source capacitance of the second transistor.

11. The amplifier module of claim 1, wherein the first and second shunt capacitances comprise:
first and second high-Q surface mount capacitors selected from metal-insulator-metal (MIM) capacitors, capacitors integrated within integrated passive devices (IPDs), and capacitors integrated within low-temperature, co-fired ceramic (LTCC) devices.

12. The amplifier module of claim 1, wherein each of the first and second shunt capacitances comprise:
a metal-insulator-metal (MIM) capacitor that includes a semiconductor substrate and a build-up structure coupled to the semiconductor substrate, wherein the build-up structure includes a first conductive layer, a second conductive layer, and a dielectric layer, and wherein a first electrode of the MIM capacitor is formed from a portion of the first conductive layer, a second electrode of the MIM capacitor is formed from a portion of the second conductive layer, and the first and second electrodes are separated from each other across a portion of the dielectric layer.

13. The amplifier module of claim 1, wherein the first power transistor die is a carrier amplifier die of a Doherty power amplifier, and the second power transistor die is a peaking amplifier die of a Doherty power amplifier.

14. The amplifier module of claim 1, wherein the first power transistor die is a peaking amplifier die of a Doherty power amplifier, and the second power transistor die is a carrier amplifier die of a Doherty power amplifier.

15. The amplifier module of claim 1, wherein the first shunt capacitance has a capacitance value in a range of 5.6 picofarads to 33.0 picofarads.

16. The amplifier module of claim 1, wherein the first shunt inductance has an inductance value in a range of 0.5 nanohenries to 5.0 nanohenries.

17. A Doherty amplifier comprising:
a substrate with a mounting surface;
a carrier amplifier die coupled to the mounting surface, wherein the carrier amplifier die includes a first transistor with a first drain terminal and a first intrinsic drain node coupled to the first drain terminal;
a peaking amplifier die coupled to the mounting surface, wherein the peaking amplifier die includes a second transistor with a second drain terminal and a second intrinsic drain node coupled to the second drain terminal;
a phase shift and impedance inversion element connected between the first drain terminal and the second drain terminal, wherein a total electrical length between the first and second intrinsic drain nodes is ninety degrees, and the phase shift and impedance inversion element has a first electrical length that is less than ninety degrees; and
a first shunt circuit coupled to the first drain terminal, wherein the first shunt circuit includes a first shunt inductance coupled in series with a first shunt capacitance, wherein the first shunt circuit is configured to at least partially resonate out a drain-source capacitance of the first transistor.

18. The Doherty amplifier of claim 17, wherein the first shunt capacitance comprises:
a high-Q surface mount capacitor selected from a metal-insulator-metal (MIM) capacitor, a capacitor integrated within an integrated passive device (IPD), and a capacitor integrated within a low-temperature, co-fired ceramic (LTCC) device.

19. The Doherty amplifier of claim 17, wherein the first shunt capacitance comprises:

a metal-insulator-metal (MIM) capacitor that includes a semiconductor substrate and a build-up structure coupled to the semiconductor substrate, wherein the build-up structure includes a first conductive layer, a second conductive layer, and a dielectric layer, and wherein a first electrode of the MIM capacitor is formed from a portion of the first conductive layer, a second electrode of the MIM capacitor is formed from a portion of the second conductive layer, and the first and second electrodes are separated from each other across a portion of the dielectric layer.

20. The Doherty amplifier of claim 17, wherein the first shunt circuit comprises:
the first shunt inductance in the form of a first wirebond array;
a second shunt inductance in the form of a chip inductor coupled in series with the first shunt inductance; and
the first shunt capacitance coupled in series with the first and second shunt inductance.

21. The Doherty amplifier of claim 17, wherein the first shunt circuit is coupled to the first drain terminal, and the Doherty amplifier further comprises:
a second shunt circuit coupled to the second drain terminal, wherein the second shunt circuit includes a second shunt inductance coupled in series with a second shunt capacitance, wherein the second shunt circuit is configured to at least partially resonate out a drain-source capacitance of the second transistor.

22. The Doherty amplifier of claim 17, wherein:
the first shunt capacitance has a capacitance value in a range of 5.6 picofarads to 33.0 picofarads; and
the first shunt inductance has an inductance value in a range of 0.5 nanohenries to 5.0 nanohenries.

* * * * *